(12) United States Patent
Keller et al.

(10) Patent No.: US 8,302,046 B1
(45) Date of Patent: Oct. 30, 2012

(54) COMPACT MODELING OF CIRCUIT STAGES FOR STATIC TIMING ANALYSIS OF INTEGRATED CIRCUIT DESIGNS

(75) Inventors: Igor Keller, Pleasanton, CA (US); King Ho Tam, Milpitas, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 816 days.

(21) Appl. No.: 12/269,037

(22) Filed: Nov. 11, 2008

(51) Int. Cl.
*G06F 17/50* (2006.01)
(52) U.S. Cl. ....................................... 716/108
(58) Field of Classification Search .................. 716/108
See application file for complete search history.

(56) References Cited

U.S. PATENT DOCUMENTS

| | | | |
|---|---|---|---|
| 6,536,026 B2 * | 3/2003 | Gullapalli | 716/113 |
| 7,493,240 B1 * | 2/2009 | Feng et al. | 703/2 |
| 7,788,617 B2 * | 8/2010 | Bhanji et al. | 716/113 |
| 2008/0092092 A1 * | 4/2008 | Dalton et al. | 716/4 |

OTHER PUBLICATIONS

C. Amin, C. Kashyap, N. Menezes, K. Killpack, and E. Chiprout; "A Multi-port Current Source Model for Multiple-Input Switching Effects in CMOS Library Cells"; DAC 2006, Jul. 24-28, 2006; pp. 247-252.

Cadence Design Systems, Inc.; "Si2 Effective Current Source Model (ECSM) Timing and Power Specification", Dec. 10, 2006; 49 pages.
J. F. Croix and D. F. Wong: "Blade and Razor: Cell and Interconnect Delay Analysis Using Current-Based Models"; DAC 2003; Jun. 2-6, 2003; pp. 386-389.
I. Keller, K. Tseng, and N. Verghese; "A robust cell-level crosstalk delay change analysis"; Proceedings of ICCAD; Nov. 2004; pp. 147-154.
P. Li, Z. Feng, and E. Acar; "Characterizing Multistage Nonlinear Drivers and Variability for Accurate Timing and Noise Analysis"; IEEE Trans. on VLSI; vol. 15, No. 11; Nov. 2007; pp. 1205-1214.

* cited by examiner

*Primary Examiner* — Jack Chiang
*Assistant Examiner* — Brandon Bowers
(74) *Attorney, Agent, or Firm* — Alford Law Group, Inc.; William E. Alford

(57) ABSTRACT

Systems, apparatus, and methods of timing analysis with a multi-operating region gate model are disclosed, including modeling a logic gate with a constant direct current (DC) voltage source during a steady state region of operation; in response to a transition from the steady state region of operation, modeling the logic gate with a time-varying voltage dependent current source during a varying current region of operation; and, in response to a transition from the variable current region of operation, modeling the logic gate with a time-invariant voltage dependent current source during an asymptotic region of operation. Instantaneous output current provided by the time varying voltage dependent current source in the VCR region is responsive to time and the instantaneous output voltage of the logic gate. Instantaneous output current provided by the time-invariant voltage dependent current source in the AR region is responsive to the instantaneous output voltage of the logic gate.

18 Claims, 24 Drawing Sheets

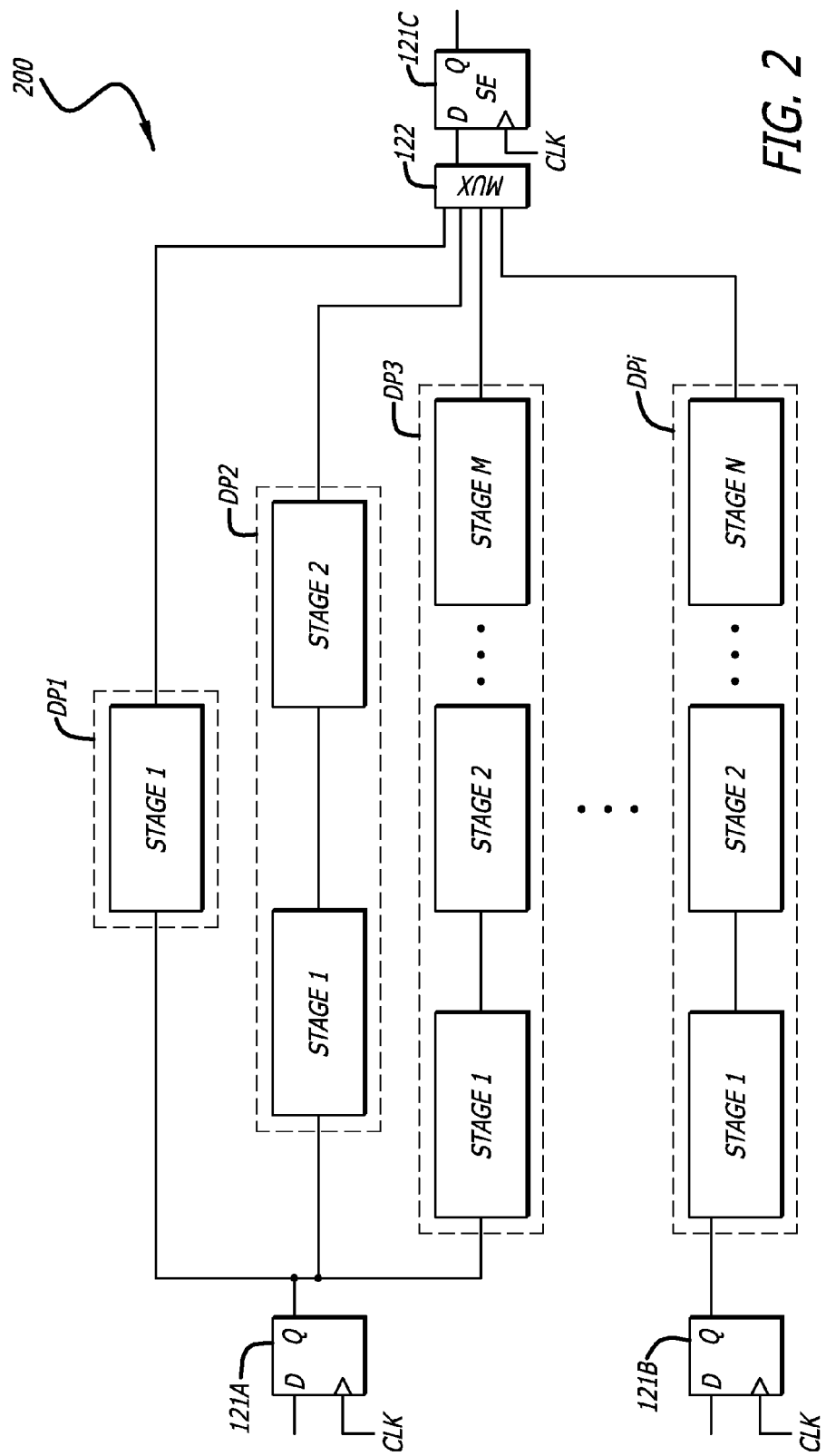

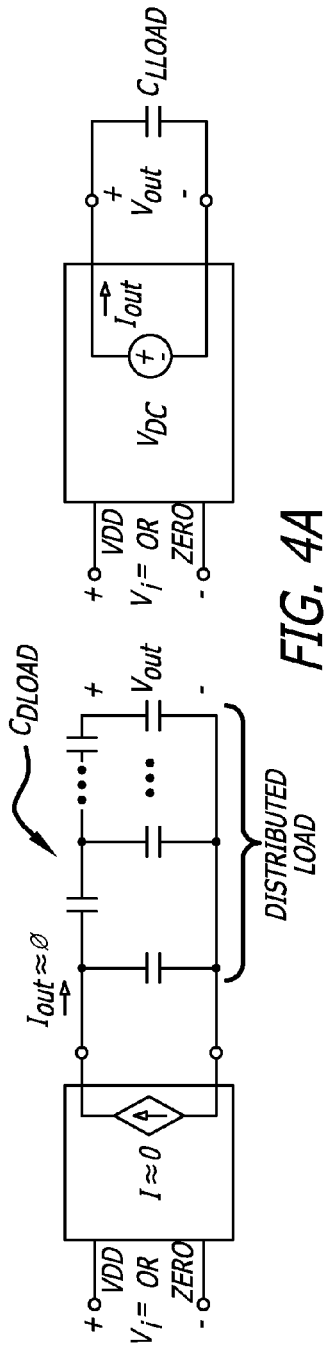
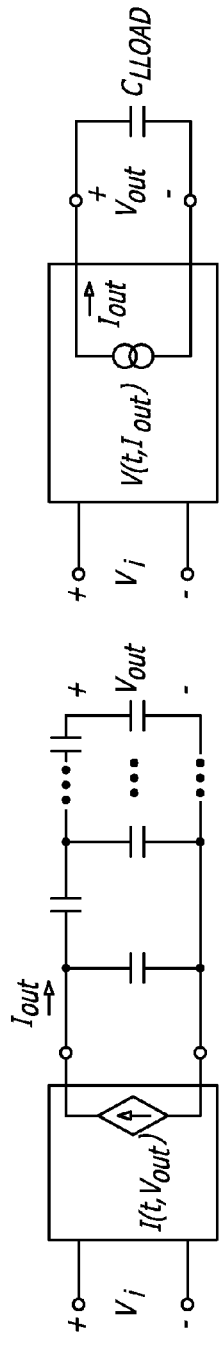
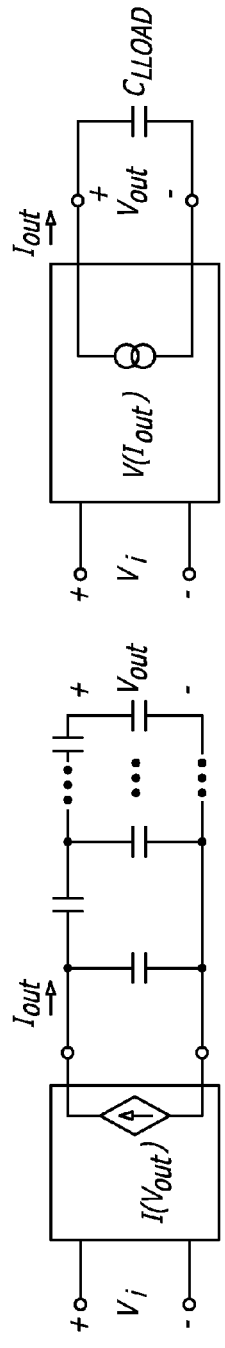
FIG. 4A
FIG. 4B
FIG. 4C

| $V_{in}$ | $V_0$ | $V_0'$ |
|---|---|---|
| 0 | 0 | $V_{dd}$ |
| $V_{dd}$ | $V_{dd}$ | 0 |

| $t$ \ $C_K$ | 1 | 2 | 3 | ... | K | $\sigma_0$ |
|---|---|---|---|---|---|---|
| $t_{00}$ | $V_0(t_{00})$ | $V_2(t_{00})$ | $V_3(t_{00})$ | ... | $V_K(t_{00})$ | |
| $t_{01}$ | $V_1(t_{01})$ | $V_2(t_{01})$ | $V_3(t_{01})$ | ... | | |

$V_0(t_{mn})$ $V_K(t_{0n})$

| $t$ \ $C_K$ | 1 | 2 | 3 | ... | K | $\sigma_m$ |
|---|---|---|---|---|---|---|
| $t_{m0}$ | $V_0(t_{m0})$ | $V_2(t_{m0})$ | $V_3(t_{m0})$ | ... | $V_K(t_{m0})$ | |
| $t_{m1}$ | $V_1(t_{m1})$ | $V_2(t_{m1})$ | $V_3(t_{m1})$ | ... | $V_K(t_{m1})$ | |
| $t_{m2}$ | $V_1(t_{m2})$ | $V_2(t_{m2})$ | $V_3(t_{m2})$ | ... | $V_K(t_{m2})$ | |
| ⋮ | ⋮ | ⋮ | ⋮ | | ⋮ | |
| $t_{mn}$ | $V_1(t_{mn})$ | $V_2(t_{mn})$ | $V_3(t_{mn})$ | ... | $V_K(t_{mn})$ | |

FIG. 10A $I_0(V_K t_{0n})$

| $t$ \ $C_K$ | 1 | 2 | 3 | ... | K | $\sigma_0$ |
|---|---|---|---|---|---|---|
| $t_{00}$ | $I(V_1 t_{00})$ | $I(V_2 t_{00})$ | $I(V_3 t_{00})$ | ... | $I(V_K t_{00})$ | |
| $t_{01}$ | $I(V_1 t_{01})$ | $I(V_2 t_{01})$ | $I(V_3 t_{01})$ | ... | | |

$I_0(V_K t_{mn})$

| $t$ \ $C_K$ | 1 | 2 | 3 | 4 | ... | K | $\sigma_m$ |
|---|---|---|---|---|---|---|---|
| $t_{m0}$ | $I(V_1 t_{m0})$ | $I(V_2 t_{m0})$ | $I(V_3 t_{m0})$ | $I(V_4 t_{m0})$ | ... | $I(V_K t_{m0})$ | |
| $t_{m1}$ | $I(V_1 t_{m1})$ | $I(V_2 t_{m1})$ | $I(V_3 t_{m1})$ | $I(V_4 t_{m1})$ | ... | $I(V_K t_{m1})$ | |
| $t_{m2}$ | $I(V_1 t_{m2})$ | $I(V_2 t_{m2})$ | $I(V_3 t_{m2})$ | $I(V_4 t_{m2})$ | ... | $I(V_K t_{m2})$ | |
| ⋮ | ⋮ | ⋮ | ⋮ | ⋮ | | ⋮ | |
| $t_{mn}$ | $I(V_1 t_{mn})$ | $I(V_2 t_{mn})$ | $I(V_3 t_{mn})$ | $I(V_4 t_{mn})$ | ... | $I(V_K t_{mn})$ | |

FIG. 10B

| $c_K$ $t$ | 1 | 2 | 3 | 4 | ... | K | |
|---|---|---|---|---|---|---|---|
| $t_{00}$ | $g(V_1 t_{00})$ | $g(V_2 t_{00})$ | $g(V_3 t_{00})$ | $g(V_4 t_{00})$ | ... | $g(V_K t_{00})$ | $\sigma_0$ |
| $t_{01}$ | $g(V_1 t_{01})$ | $g(V_2 t_{01})$ | $g(V_3 t_{01})$ | $g(V_4 t_{01})$ | ... | $g(V_K t_{01})$ | |
| ⋮ | ⋮ | ⋮ | ⋮ | ⋮ | | ⋮ | |
| $c_K$ $t$ | 1 | 2 | 3 | 4 | ... | K | |
| $t_{m0}$ | $g(V_1 t_{m0})$ | $g(V_2 t_{m0})$ | $g(V_3 t_{m0})$ | $g(V_4 t_{m0})$ | ... | $g(V_K t_{m0})$ | $\sigma_m$ |
| $t_{m1}$ | $g(V_1 t_{m1})$ | $g(V_2 t_{m1})$ | $g(V_3 t_{m1})$ | $g(V_4 t_{m1})$ | ... | $g(V_K t_{m1})$ | |
| $t_{m2}$ | $g(V_1 t_{m2})$ | $g(V_2 t_{m2})$ | $g(V_3 t_{m2})$ | $g(V_4 t_{m2})$ | ... | $g(V_K t_{m2})$ | |
| ⋮ | ⋮ | ⋮ | ⋮ | ⋮ | | ⋮ | |
| $t_{mn}$ | $g(V_1 t_{mn})$ | $g(V_2 t_{mn})$ | $g(V_3 t_{mn})$ | $g(V_4 t_{mn})$ | ... | $g(V_K t_{mn})$ | |

*FIG. 10C*

| $c_K$ $t$ | $c_1$ | $c_2$ | $c_3$ | ... | $c_K$ | |
|---|---|---|---|---|---|---|
| $t_{00}$ | $VIG_{001}$ | $VIG_{002}$ | $VIG_{003}$ | ... | $VIG_{00K}$ | $\sigma_0$ |
| $t_{01}$ | $VIG_{011}$ | $VIG_{012}$ | $VIG_{013}$ | ... | $VIG_{01K}$ | |
| ⋮ | ⋮ | ⋮ | ⋮ | | $VIG_{0nk}$ | |
| $c_K$ $t$ | $c_1$ | $c_2$ | $c_3$ | ... | $c_K$ | |
| $t_{m0}$ | $VIG_{m01}$ | $VIG_{m02}$ | $VIG_{m03}$ | ... | $VIG_{m0K}$ | $\sigma_m$ |
| $t_{m1}$ | $VIG_{m11}$ | $VIG_{m12}$ | $VIG_{m13}$ | ... | $VIG_{m1K}$ | |
| $t_{m2}$ | $VIG_{m21}$ | $VIG_{m22}$ | $VIG_{m23}$ | ... | $VIG_{m2K}$ | |
| ⋮ | ⋮ | ⋮ | ⋮ | | ⋮ | |
| $t_{mn}$ | $VIG_{mn1}$ | $VIG_{mn2}$ | $VIG_{mn3}$ | ... | $VIG_{mnK}$ | |

*FIG. 10D*

| $V_z$ \ | $V_1$ | $V_2$ | $V_3$ | $V_4$ | ... | $V_z$ |
|---|---|---|---|---|---|---|
| $t_z$ | $t_1$ | $t_2$ | $t_3$ | $t_4$ | ... | $t_z$ |
| $I_z$ | $I_1$ | $I_2$ | $I_3$ | $I_4$ | ... | $I_z$ |
| $G_z$ | $G_1$ | $G_2$ | $G_3$ | $G_4$ | ... | $G_z$ |

$C_{LOAD1}$

| $V_z$ \ | $V_1$ | $V_2$ | $V_3$ | $V_4$ | ... | $V_z$ |
|---|---|---|---|---|---|---|
| $t_z$ | $t'_1$ | $t'_2$ | $t'_3$ | $t'_4$ | ... | $t'_z$ |
| $I_z$ | $I'_1$ | $I'_2$ | $I'_3$ | $I'_4$ | ... | $I'_z$ |
| $G_z$ | $G'_1$ | $G'_2$ | $G'_3$ | $G'_4$ | ... | $G'_z$ |

$C_{LOAD2}$

FIG. 11A

| $V_z$ \ | $V_1$ | $V_2$ | $V_3$ | $V_4$ | ... | $V_z$ |
|---|---|---|---|---|---|---|
| $t_{1,z}$ | $t_{1,1}$ | $t_{1,2}$ | $t_{1,3}$ | $t_{1,4}$ | ... | $t_{1,z}$ |
| $I_{1,z}$ | $I_{1,1}$ | $I_{1,2}$ | $I_{1,3}$ | $I_{1,4}$ | ... | $I_{1,z}$ |
| $t_{2,z}$ | $t_{2,1}$ | $t_{2,2}$ | $t_{2,3}$ | $t_{2,4}$ | ... | $t_{2,z}$ |
| $I_{2,z}$ | $I_{2,1}$ | $I_{2,2}$ | $I_{2,3}$ | $I_{2,4}$ | ... | $I_{2,z}$ |
| $G_z$ | $G_1$ | $G_2$ | $G_3$ | $G_4$ | ... | $G_z$ |

$C_{LOAD\ REF}$
$C_{LOAD1}$
$C_{LOAD2}$
$C_{LOAD1}$ OR $C_{LOAD2}$

FIG. 11B

| $V_z$ \ | $V_1$ | $V_2$ | $V_3$ | $V_4$ | ... | $V_z$ |
|---|---|---|---|---|---|---|
| $t_z$ | $t''_1$ | $t''_2$ | $t''_3$ | $t''_4$ | ... | $t''_x$ |

$C_{LOAD\ NEW}$

FIG. 11C

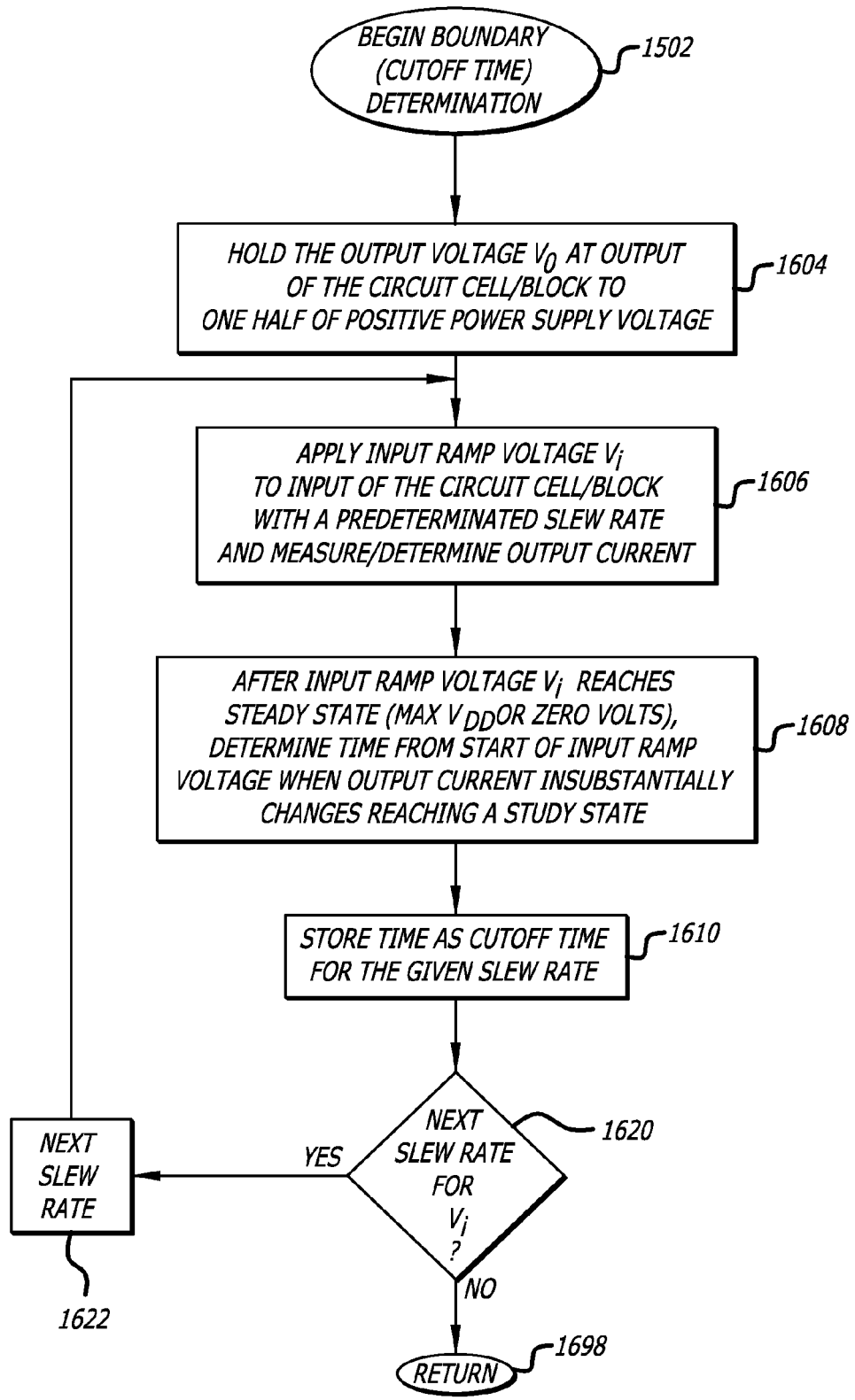

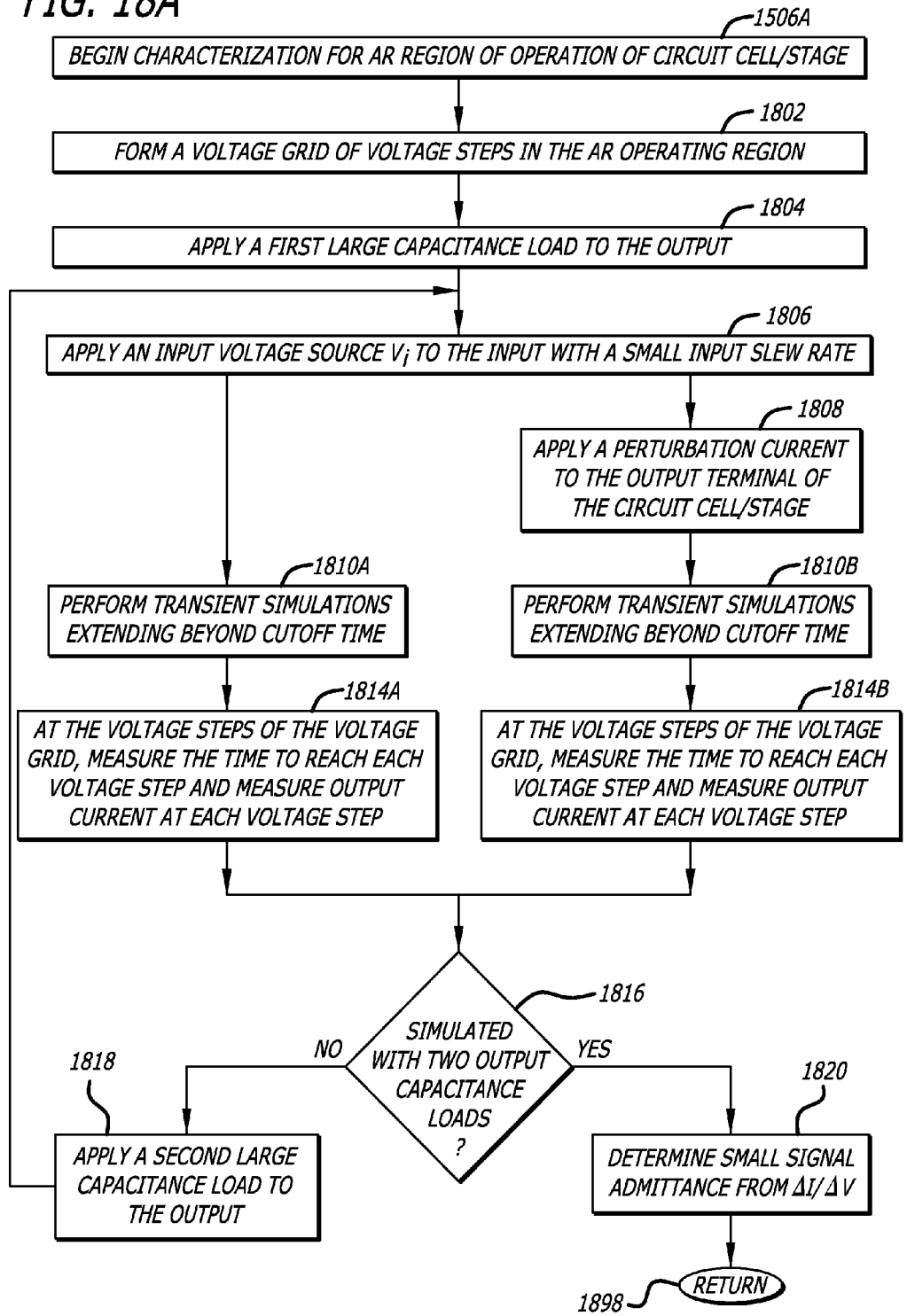

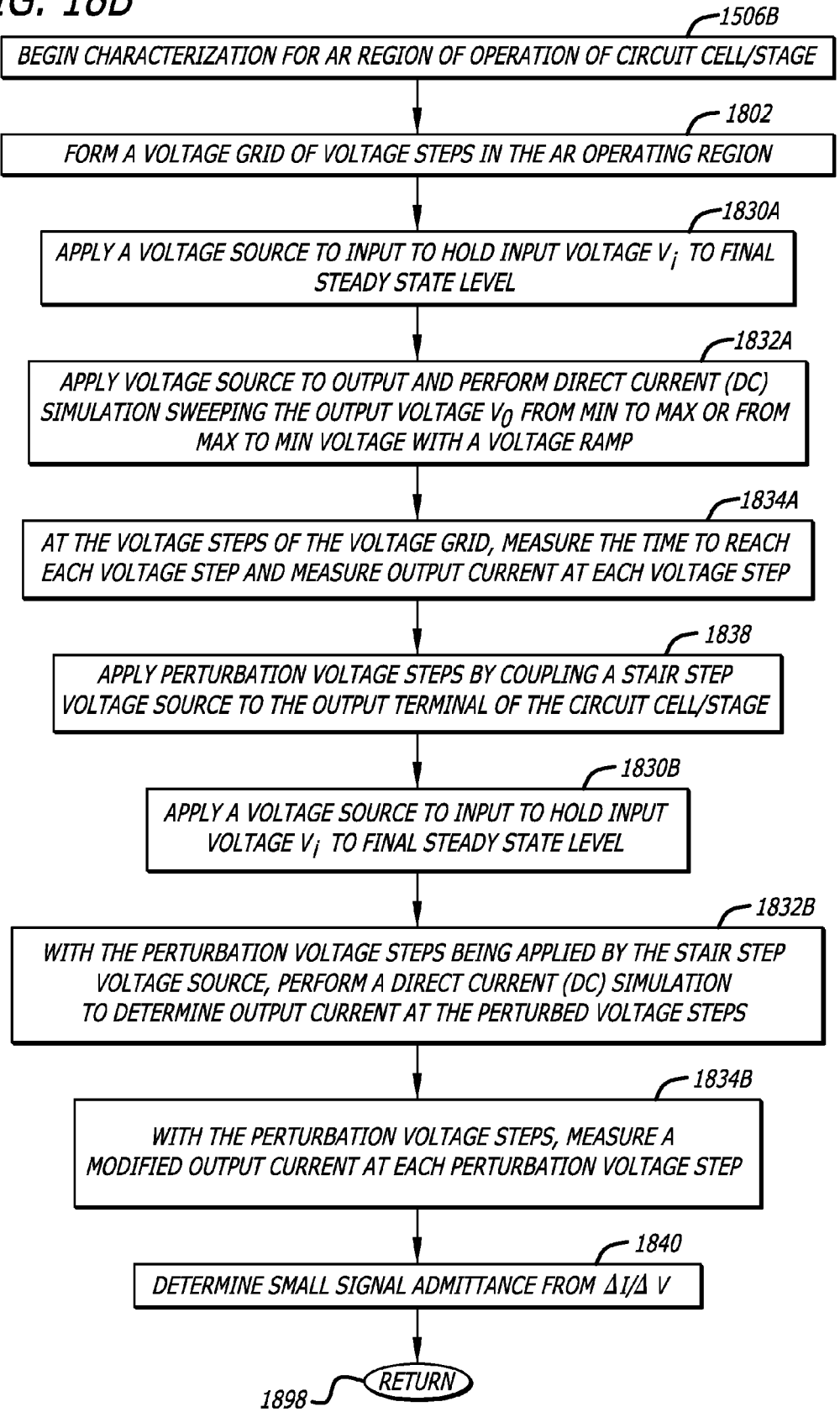

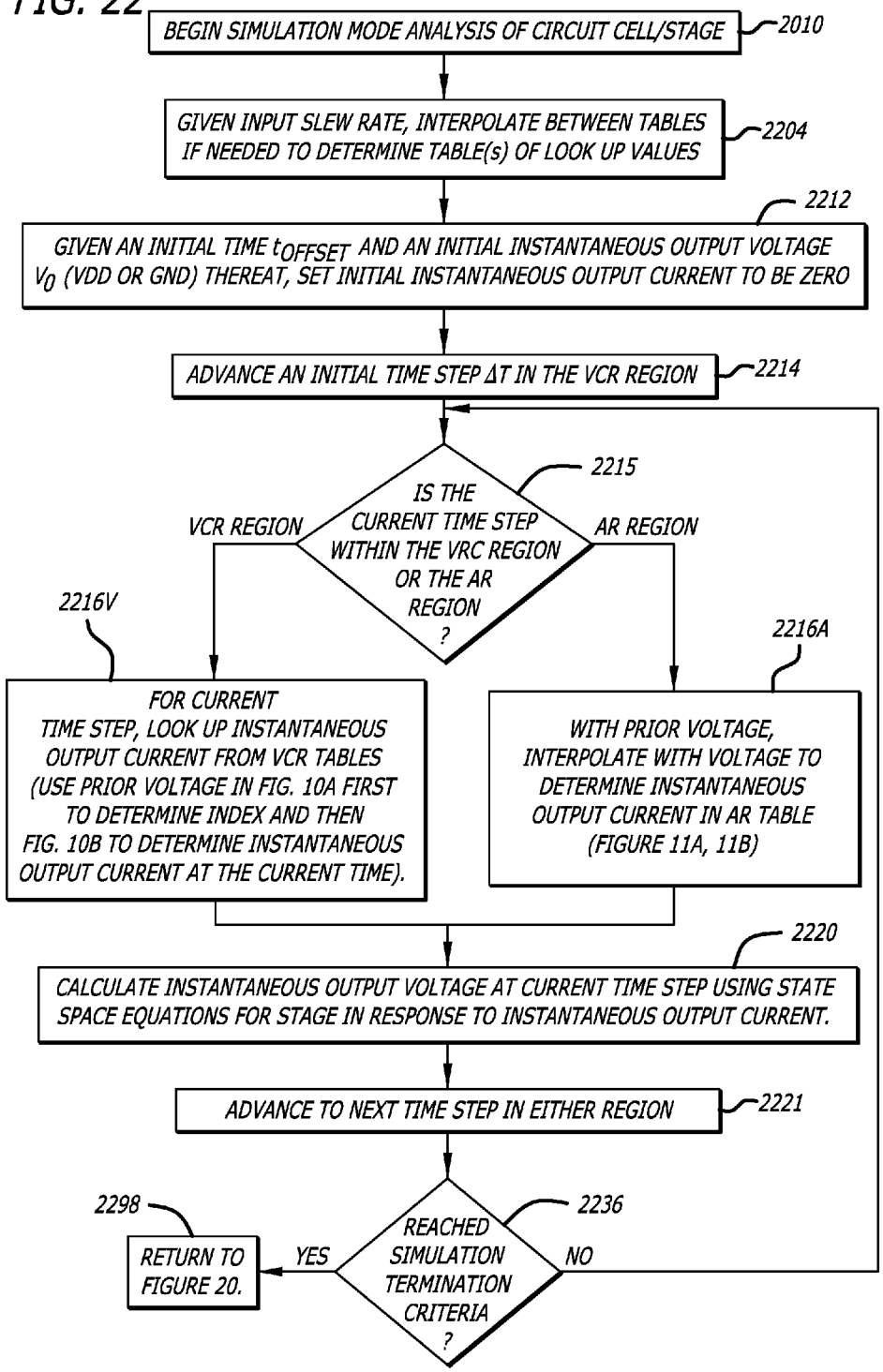

US 8,302,046 B1

COMPACT MODELING OF CIRCUIT STAGES FOR STATIC TIMING ANALYSIS OF INTEGRATED CIRCUIT DESIGNS

FIELD

The embodiments of the invention relate generally to integrated circuit design software tools, such as static timing analysis software tools and signal integrity analysis software tools for designing integrated circuits.

BACKGROUND

Electronic computer aided design (ECAD) software tools for static timing analysis (STA) may be used to estimate timing delays in an electronic circuit design, such as electronic circuit designs that may be found in integrated circuit designs. With improved process technology, smaller transistor channel lengths have become available to increase the number of electronic circuits and functionality that can be designed into an integrated circuit.

However with a greater number of circuits and functionality, greater demands are placed on the ECAD software tools to simulate the designs in a timely manner. Methods to more quickly simulate an integrated circuit design can increase design efficiency and possibly reduce the time to market of an integrated circuit.

BRIEF SUMMARY

The embodiments of the invention are best summarized by the claims that follow below.

Briefly however, in accordance with one embodiment of the invention, a multi-operating region gate model is disclosed that operates over three different operating regions: a steady-state region (SSR), a varying current region (VCR), and an asymptotic region (AR). The multi-operating region gate model generally models each different region by a different current source or current source model. In the steady state region, the output current is substantially zero so it may be considered an open circuit or a current source with zero current. A current source model may be used to model the varying current region (VCR) of operation and may be referred to as a time-varying voltage dependent current source. The time-varying voltage dependent current source in the VCR region generates an instantaneous output current in response to both time and instantaneous output voltage of the circuit cell/stage. A current source model used in modeling the asymptotic region (AR) of operation may also be referred to as a time-invariant voltage dependent current source. In the AR region, the time-invariant voltage dependent current source generates an instantaneous output current in response to the instantaneous output voltage of the circuit cell/stage substantially without regard to time. The multi-operating region gate model may also generally be thought of modeling each different region with a different voltage source in response to an active transition of its output due to a switching input.

BRIEF DESCRIPTIONS OF THE DRAWINGS

FIG. 2 is a block diagram of a portion of an exemplary netlist with stages/blocks of standard circuit cells along delay paths between flip flops.

FIGS. 4A-4C illustrate schematic/block diagrams of the multiple operating regions for the multi-operating region gate model.

FIG. 9 illustrates a table of output voltages for the multi-stage operating region gate model in a steady state operating region.

FIG. 10A illustrates a plurality of two dimensional tables (or a single three dimensional table with different time points between levels) of instantaneous output voltages for the multi-stage operating region gate model in the VCR operating region.

FIG. 10B illustrates a plurality of two dimensional tables (or a single three dimensional table with different time points between levels) of instantaneous output current for the multi-stage operating region gate model in the VCR operating region.

FIG. 10C illustrates a plurality of two dimensional tables (or a single three dimensional table with different time points between levels) of instantaneous small signal admittance for the multi-stage operating region gate model in the VCR operating region.

FIG. 10D illustrates a plurality of two dimensional tables (or a single three dimensional table with different time points between levels) of instantaneous output voltages, output current, and small signal admittance for the multi-stage operating region gate model in the VCR operating region.

FIGS. 11A-11B illustrates one or more two dimensional tables of time, instantaneous output voltage, output current, and small signal admittance for the AR operating region of the multi-stage operating region gate model for reference capacitance loads.

FIG. 11C illustrates scaling entries of the table of FIG. 11A for an actual capacitive load coupled to the circuit stage for the multi-stage operating region gate model in the AR operating region.

FIG. 16 illustrates a flow chart diagram for characterizing the cutoff time for the multi-operating region gate model of the circuit under test.

FIG. 18 illustrates a flow chart diagram for characterizing the output current and output voltage of the VCR region for the multi-operating region gate model of the circuit under test.

FIG. 22 is a flowchart illustrating a simulation mode delay calculation of timing arcs in a circuit cell/block using the multi-operating region gate model of the circuit cell/block.

DETAILED DESCRIPTION

In the following detailed description of the embodiments of the invention, numerous specific details are set forth in order to provide a thorough understanding. However, it will be obvious to one skilled in the art that the embodiments of the invention may be practiced without these specific details. In other instances well known methods, procedures, components, and circuits have not been described in detail so as not to unnecessarily obscure aspects of the embodiments of the invention.

Introduction

Figure 1A:
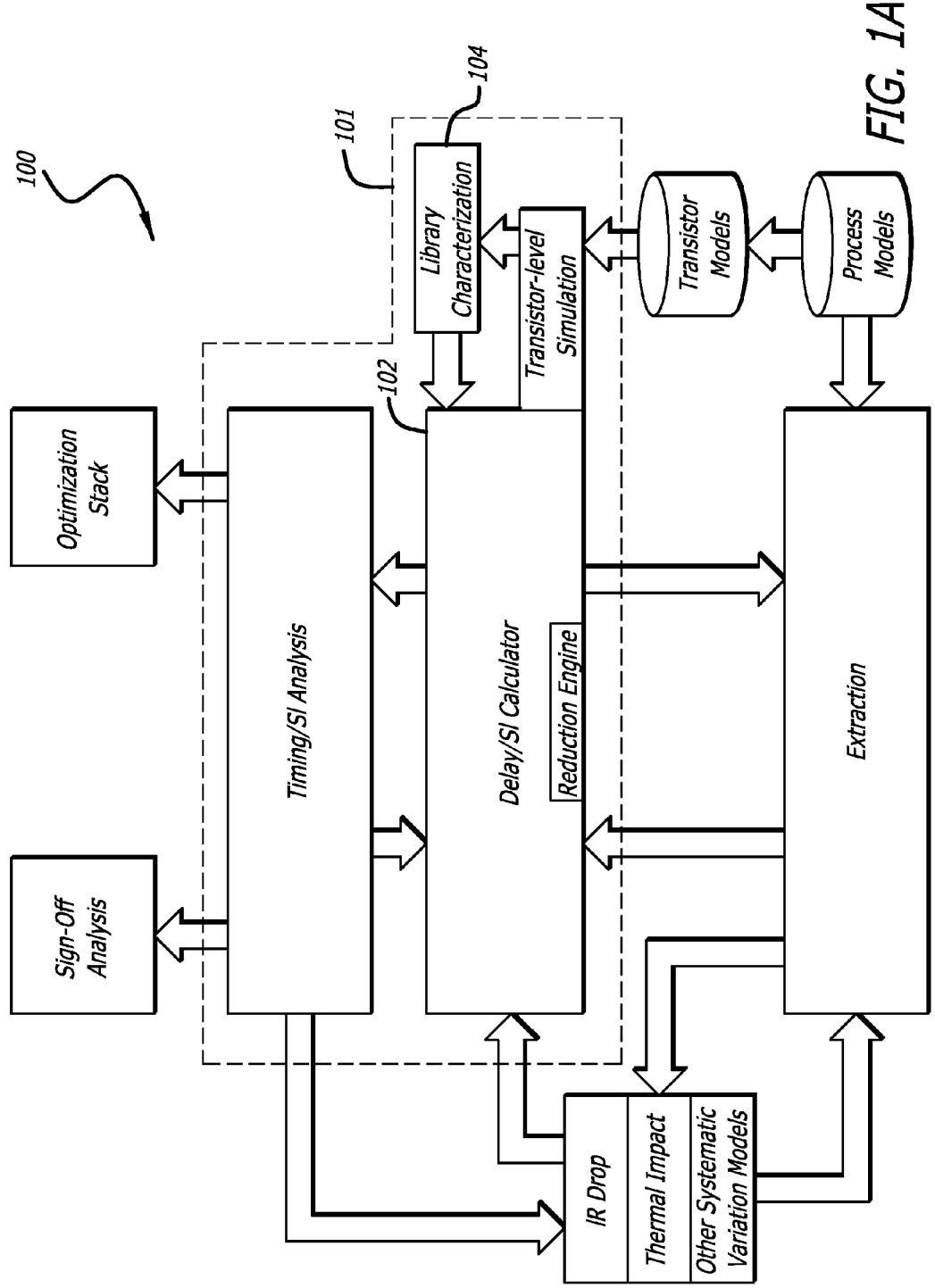
FIG. 1A is a block diagram of an integrated circuit design flow including a statistical static timing analyzer in accordance with an embodiment of the invention.

FIG. 1A illustrates an exemplary integrated circuit design flow 100. Digital performance analysis software tools, such as Static Timing Analysis (STA) software tools and Signal Integrity (SI) Analysis software tools 101, are used to estimate the performance of an integrated circuit chip. The software tools 101 may include a library characterization tool 104, a transistor level simulation tool (e.g., SPICE), a multi-operating region gate delay calculator 102, and a timing/signal integrity (SI) analyzer. As shown in FIG. 1A, these software tools may internally employ different levels of abstraction, a graph level abstraction, a net level abstraction, and a shape level abstraction.

At the graph level of abstraction, the software tool works with the entire circuit design as a design graph. The graph level abstraction propagates quantities or metrics of interest from the inputs of the circuit design to the outputs of the circuit design. For example, an STA tool may propagate arrival times throughout the circuit design.

At the net level of abstraction, the STA software tool calculates quantities of interest for each of the nets in the design. While doing an SI analysis, an SI analysis software tool may calculate the crosstalk glitch induced on a specific net.

At the shape level of abstraction, the software tools work with information from the actual chip layout. The information may include device sizes and interconnect parasitics, for example, such as can be obtained from a parasitic extractor.

An electrical calculation engine component or delay calculator 102 is provided for the net level abstraction layer of electrical analysis software tools.

Figure 1B:
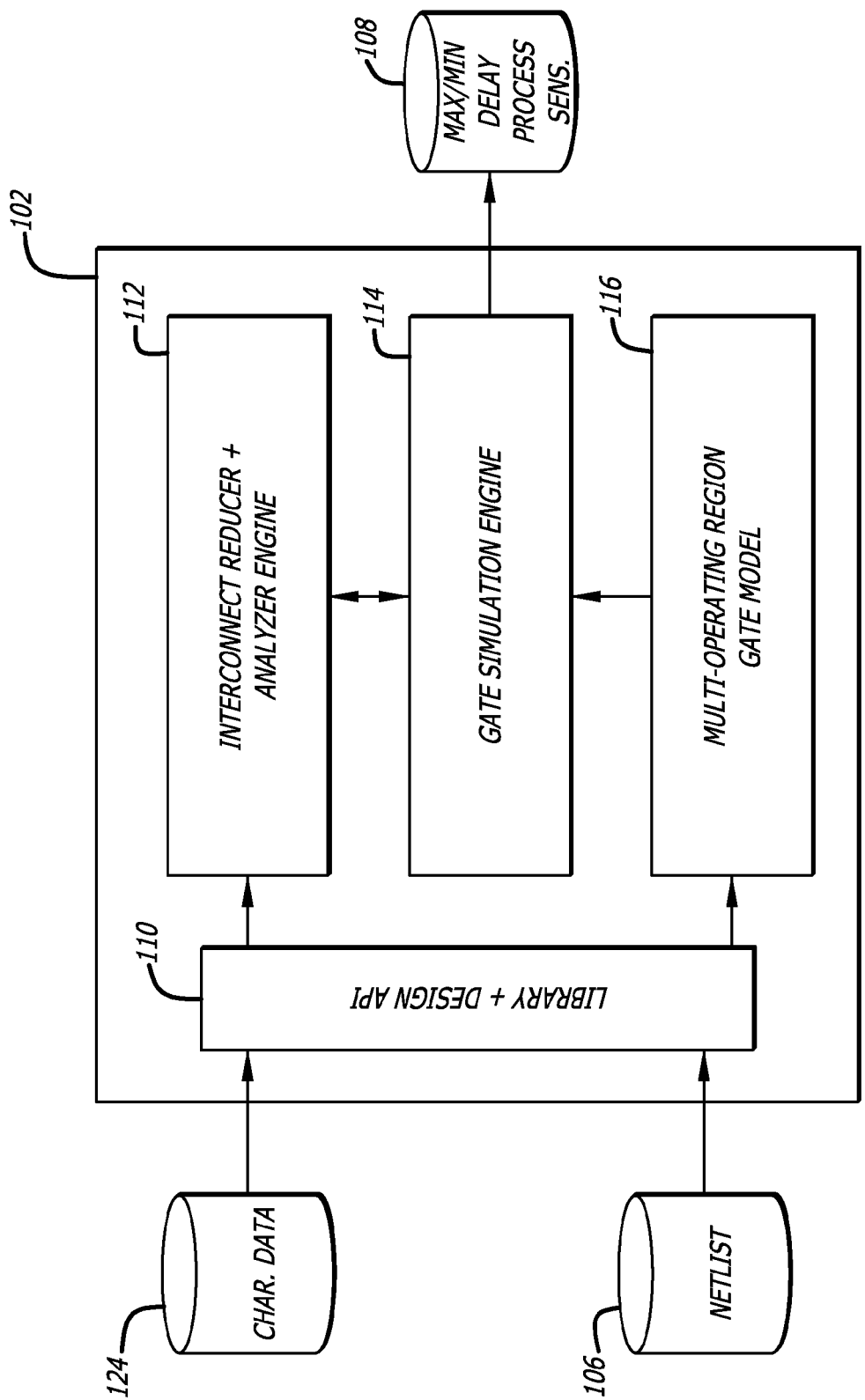
FIG. 1B is a block diagram of a delay calculator including a multi-operating region gate model.

Referring now to FIG. 1B, a block diagram of a multi-operating region gate delay calculator 102 is illustrated. The delay calculator 102 may also be referred to herein as an electrical calculator. The delay calculator 102 receives characterization data 124 and a netlist 106 and its underlying integrated circuit design data to generate timing delays 108 (e.g., max timing delay, min timing delay) including process sensitivities. The characterization data 124 may be part of a cell library of logic cells.

The delay calculator 102 includes an application programming interface (API) 110, an interconnect reducer & analysis engine 112, a gate simulation engine 114, and a multi-operating region gate model 116 coupled together as shown.

The interconnect reducer & analysis engine 112 receives the netlist 106 including a defined interconnect of standard cells to reduce it down to a simplified model for use with the gate simulation engine 114. The interconnect reduction and analysis engine 112 reduces the extracted parasitic network down to a simplified load model. Typically, the extracted parasitic network corresponding to an output net can be very large. Since only the inputs and outputs of the net need to be monitored, the interconnect network may be reduced to create a smaller, electrically equivalent representation speeding up delay calculations while preserving the input-to-output electrical behavior of the net.

The multi-operating region gate model 116, described in further detail below, receives the characterization data 124 and models circuit cells/stages in a given stage of a delay path. Circuit cell, circuit stage, and logic gate may be used interchangeably herein to refer to the same sub-circuit device instantiated from a circuit cell library into an integrated circuit design.

The multi-operating region gate model 116 describes the electrical behavior of a standard cell in an abstract fashion in order to speed electrical calculations, such as delay calculations, noise delay calculations, and sensitivity calculations. The parameters of the multi-operating region gate model 116 are usually derived by a library characterization process, such as described below.

The gate simulation engine 114 calculates the output waveform at the output of a given gate in response to the input stimulus as well as the multi-operating region gate model 116 and its parameters. A simplified load model (e.g., a lumped load or a reduced order model load) may be used to model the effect of the interconnect loading on the gate. A noise model may also be used to model noise from aggressors in the circuit cell or stage.

The parameters for each circuit cell corresponding to the multi-operating region gate model are typically stored in a cell library. IC netlist design data 106 may stored in some form in a data base. One or more application programming interfaces (API) 110 interact with the library and the design data to read information there-from. Another one or more APIs 110 may be used by graph level engines, operating at the graph level on the netlist to determine delays along data paths for example, to call the delay calculator 110 and obtain the timing results of the calculations at each gate along a graphed path.

Referring now to FIG. 2, a block diagram of a portion of an exemplary netlist including a plurality of delay paths DP1-DPi from D flip-flops/latches/registers 121A-121B multiplexed into a D flip-flop/latch/register 121C by a multiplexer 122. The delay calculator 102 may be used to compute the timing delays through the delay paths between the D flip-flops/latches/registers 121A-121B and the D flip-flop/latch/register 121C.

Each of the delay paths DP1-DPi may have various circuit stages or circuit cells coupled in series. A first delay path DP1 includes a single circuit stage Stage1. A second delay path DP2 includes two circuit stages, Stage1 and Stage2. A third delay path DP3 includes M circuit stages, Stage1 through StageM. An $i^{th}$ delay path Dpi includes N circuit stages, Stage1 through StageN.

The multi-operating region gate model 116 used in the delay calculator may also be referred to as a cell-level robust electrical analysis model (CREAM model). The multi-operating region gate model treats each circuit cell/stage in the abstract, such as a block box with input pins and output pins.

Figure 3:
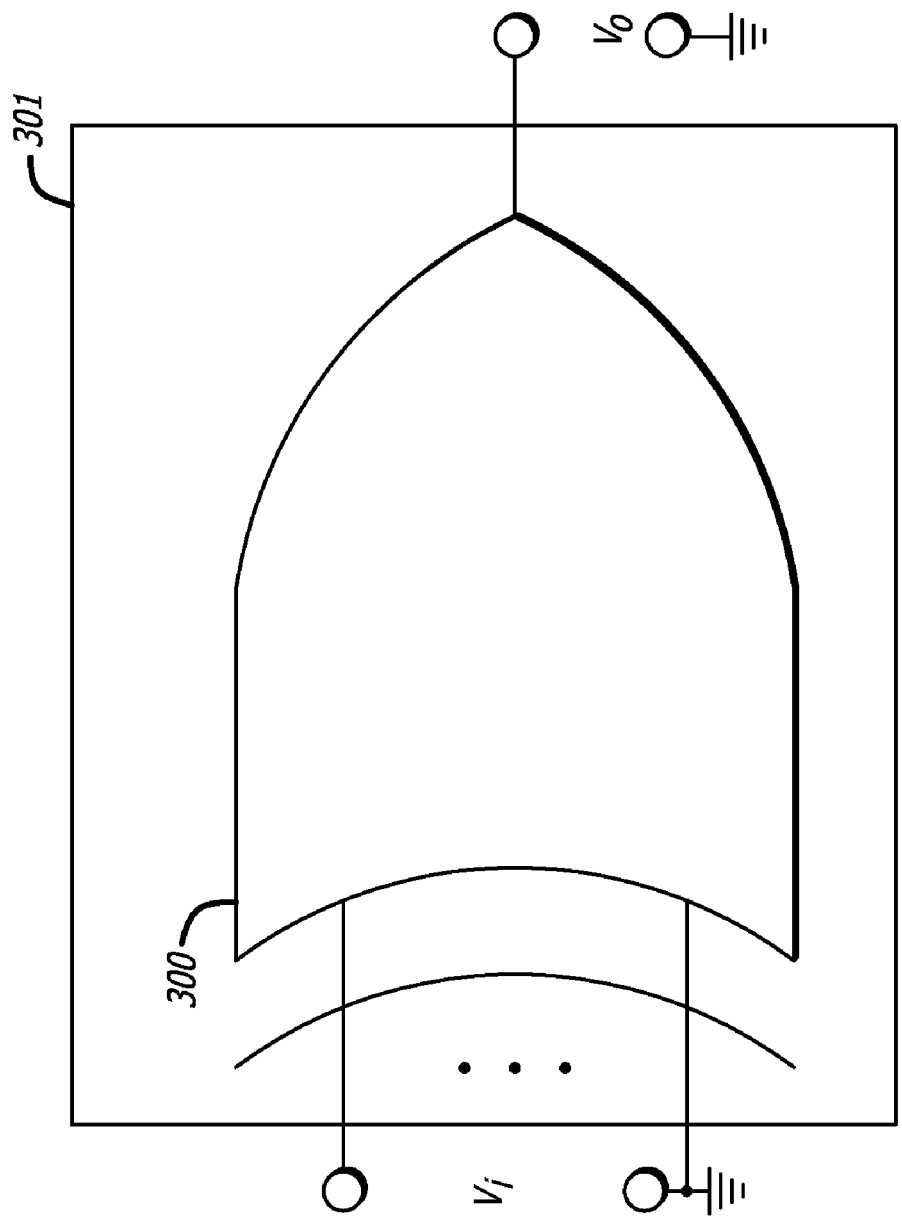
FIG. 3 illustrates a block box model view of a standard circuit cell/block, such as an XOR gate.

FIG. 3 illustrates an abstracted view or black box 301 view of a circuit cell, such as an XOR gate 300. The exemplary XOR gate 300 may generally be modeled by different current sources in the black box 301 for operation in different regions during an active transition of its output due to a switching input.

Multi-Operating Region Gate Model

Figure 5:
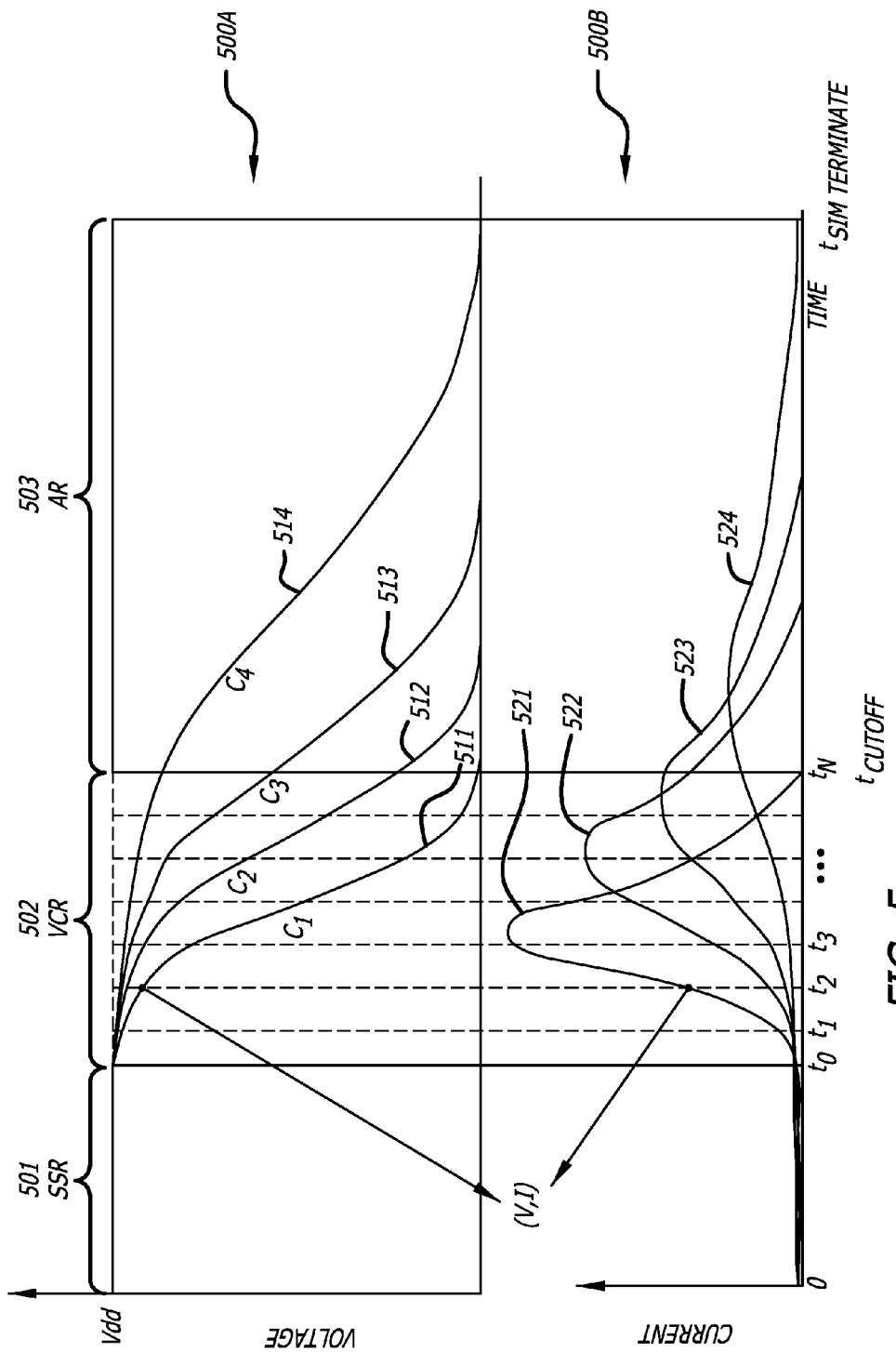
FIG. 5 illustrates a waveform timing diagram of output voltage and output current for the multiple operating regions of the multi-operating region gate model.

Referring momentarily to FIG. 5, voltage waveform diagrams 500A and current waveform diagrams 500B for a multi-operating region gate model are illustrated. A multi-operating region gate model operates over three different regions, a steady-state region (SSR) 501, a varying current region (VCR) 502, and an asymptotic region (AR) 503. The multi-operating region gate model generally models each different region by a different current source or current source model. The multi-operating region gate model may also generally be thought of modeling each different region of operation with a different voltage source, in addition to the different current sources, in response to an active transition of its output due to a switching input.

The current source model used in modeling the steady state region (SSR) of operation may be an open circuit or a current source with a high impedance level because the instantaneous output current during the steady state region of operation is substantially zero for digital circuits. The voltage source model modeling the SSR region of operation may be a direct current (DC) voltage source with a steady state voltage level to hold the output thereto. Thus, the instantaneous output voltage of the multi-region gate model is a steady state level during the time within the SSR region.

The instantaneous output current and the instantaneous output voltage are respectively a level of output current and a level of output voltage at instants of time. As shown in FIG. 5, when transitioning between operating regions and/or over time, the level of output current and the level of output voltage at instants of time (respectively, the instantaneous output current and the instantaneous output voltage) can vary.

The current source model used in modeling a varying current region (VCR) of operation may also be referred to as a time-varying voltage dependent current source. The time-varying voltage dependent current source generates an instantaneous output current in response to both time and instantaneous output voltage of the circuit cell/stage in the VCR region of operation. The current source model used in an asymptotic region (AR) of operation may also be referred to as a time-invariant voltage dependent current source. The time-invariant voltage dependent current source generates an instantaneous output current in response to the instantaneous output voltage of the circuit cell/stage in the AR region of operation substantially without regard to time.

The steady-state region 501 occurs when the input voltage is a steady state or direct current DC voltage ($V_{DC}$) at a high logic level or a low logic level from time zero to time $t_0$. The direct current DC voltage $V_{DC}$ may also be referred to as a steady state voltage level. The input voltage $V_i$ starts changing at time $t_0$, which may also be referred to herein at the offset time $t_{offset}$, to begin the varying current region (VCR) 502.

A cutoff time $t_{cutoff}$ ends the varying current region (VCR) 502 and begins the asymptotic region (AR) 503. In FIG. 5, cutoff time $t_{cutoff}$ is the same for each of the curves 511-514 and 521-524 even though they were characterized for different output capacitance loads because they were characterized with the same input slew rate for the input voltage Vi. For a different input slew rate, the cutoff time $t_{cutoff}$ will differ. The asymptotic region (AR) 503 continues infinitely on in time. However, a simulation termination criteria may be used to terminate the characterization period at a simulation termination time $t_{sim-terminate}$. The simulation termination criteria, for example, may be a level of percentage change in output current or output voltage over a time period. Other criteria may be used instead to terminate the simulation of the circuit cell/stage for the given input logic change and return it to a steady state region. Even though the AR region is characterized using a transient simulation from the cutoff time to the simulation termination time, the computed output current as a function of output voltage I(V) is valid for any time point within the AR region.

In the VCR operating region 502, the output current and the output small signal admittance vary strongly with time. The output current is a function of both time and output voltage, $I_o \propto I(t, V_{out})$. The VCR region may also be referred to as the time varying region. The VCR region is characterized by a grid of a plurality of time points for which output voltage, output current, and small signal output admittance are recorded for different output capacitance loads ($V_k$, $I(V_k)$, $g(V_k)$; k=1, ..., K, where K is the total number of loads) for each given slew rate $\sigma_m$ of the input voltage, as illustrated by the plurality of two dimensional tables illustrated in FIGS. 10A-10D.

FIG. 5 illustrates a grid of N time points $t_1$ to $t_N$ ($t_N$ being the cutoff time) in the VCR region 502. In one embodiment, the number of time points N may be ten, for example. For a given slew rate, FIG. 5 further illustrates output voltage curves 511-514 and output current curves 521-524 for four capacitive loads C1-C4, respectively. For a given capacitive load, a voltage current pair (V,I) are defined at each time point of the grid.

The cutoff time may vary with variances in the input slew rate and change the response in the VCR region. However, after the cutoff time, it has been observed that the output current follows a DC-like, time-invariant behavior in the AR region. That is, for time $t > t_{cutoff}$, the output current $I_o(V_o)$ becomes substantially a function of output voltage without regard to time. The cutoff time is a time boundary between the variable current region of operation and the asymptotic region of operation of the circuit cell. The plurality of two dimensional tables illustrated in FIGS. 10A-10D illustrate different time points $t_{mn}$, for each table in response to the input slew rate. The last time point $t_{mn}$, in each table of FIGS. 10A-10D is the cut off time that will differ from table to table with a different input slew rate.

The cutoff time does not necessarily occur at a time point where the input transition becomes a steady state level, such as at the positive power supply voltage (VDD) or ground. With multi-stage gates, the cutoff time may be both before or after the time when an input stabilizes to its steady state.

In the AR operating region, without regard to time and input voltage slew rate, the output current can be represented as a function of output voltage alone, $I_o \propto I(V_{out})$. The AR region may also be referred to as the time invariant region. The AR region is characterized by an asymptotic transition (AT) for which output voltage, output current, small signal output admittance are recorded at Z time points $(t, V_o, I_o, g)$ for one or two different output capacitance loads, regardless of the slew rate of the input voltage, as illustrated by the table of FIG. 11A. The table of FIG. 11A of Z time points $(t_z, V_z, I_z, g_z)$ represents an asymptotic current/voltage curve within the AR region. Output voltage responses for different lumped capacitive loads may be constructed from a known asymptotic transition (AT) by means of stretching (scaling) as is illustrated by the table of FIG. 11B.

Figure 8A:
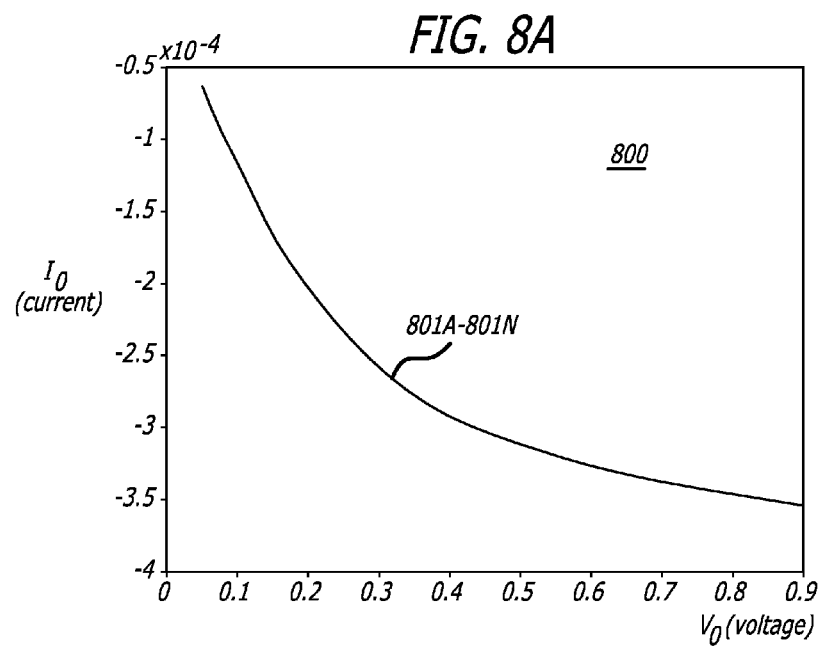
FIG. 8A illustrates a plurality of output current versus output voltage curves plotted in the AR region for various loads.

FIG. 8A illustrates a chart 800 including a plurality of curves 801A-801N plotting output current versus output voltage in the AR region. Regardless of the lumped capacitive load and simulation time in the AR region, the output voltage and output current are asymptotic in the AR region. With the output voltage and the output current being asymptotic in the AR region, the values stored to substantially represent the output voltage response and the output current response of the multi-operating region gate model in the AR region can be reduced.

With a capacitance load $C_{load}$ coupled to the output pin, an autonomous (time independent) Kirkoff Current Law (KCL) equation may be written as $$C_{load} \frac{dV}{dt} + I(V_{out}) = 0.$$

Solving the KCL equation for time as a function of voltage results in the following closed form integral equation $$t = -\frac{1}{C_{load}} \int_0^V \frac{dV'}{I(V')}.$$

This integral equation shows that the time to reach a given voltage in the AR region scales with the inverse of the capacitance load $C_{load}$. Thus, some time after the input reaches a stable steady state, tails of output transitions in the AR region become isomorphic. If one transition tail is known in the AR region for a given load, a transition tail for a different output load may be determined by time stretching techniques.

Figure 8B:
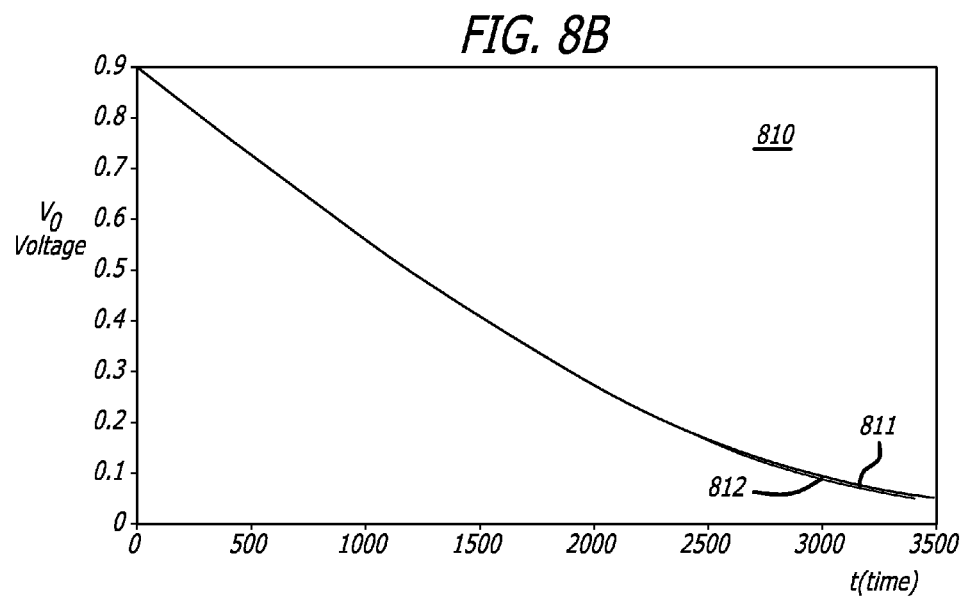
FIG. 8B illustrates a reference curve and a scaled or stretched curve in the AR region for a different load.

FIG. 8B illustrates a chart 810 including a first curve 811 plotting output voltage versus time in the AR region for a given lumped capacitive load. A second curve 812 is a normalized curve that plots output voltage versus time in the AR region for a different lumped capacitive load. As shown in FIG. 8B, the second curve 812 when normalized substantially matches the first curve 811 in the AR region. Thus, by storing one or two curves in the AR region for one or two given capacitive loads, other curves in the AR region for other capacitive loads may be generated by appropriately scaling and or interpolating. With fewer curves being stored to model the AR region for each circuit cell/stage of a cell library, the multi-operating region gate model is more compact While a number of values are stored to represent the VCR region in detail, the cutoff time $t_{cutoff}$ that defines the beginning of the AR region cuts off the detailed storage requirements to represent the multi-operating region gate model. The AR region of the multi-operating region gate model can be simply represented by a couple of tables, regardless of input slew and output capacitive load. Thus, the multi-operating region gate model is a compact model that increases computer efficiency.

FIG. 4A illustrates a schematic/block diagram of the steady-state region (SSR) 501 for the multi-operating region gate model. FIG. 4B illustrates a schematic/block diagram of the varying current region (VCR) 502 for the multi-operating region gate model. FIG. 4C illustrates a schematic/block diagram of the asymptotic region (AR) 503 for the multi-operating region gate model.

Figures 19, 20:
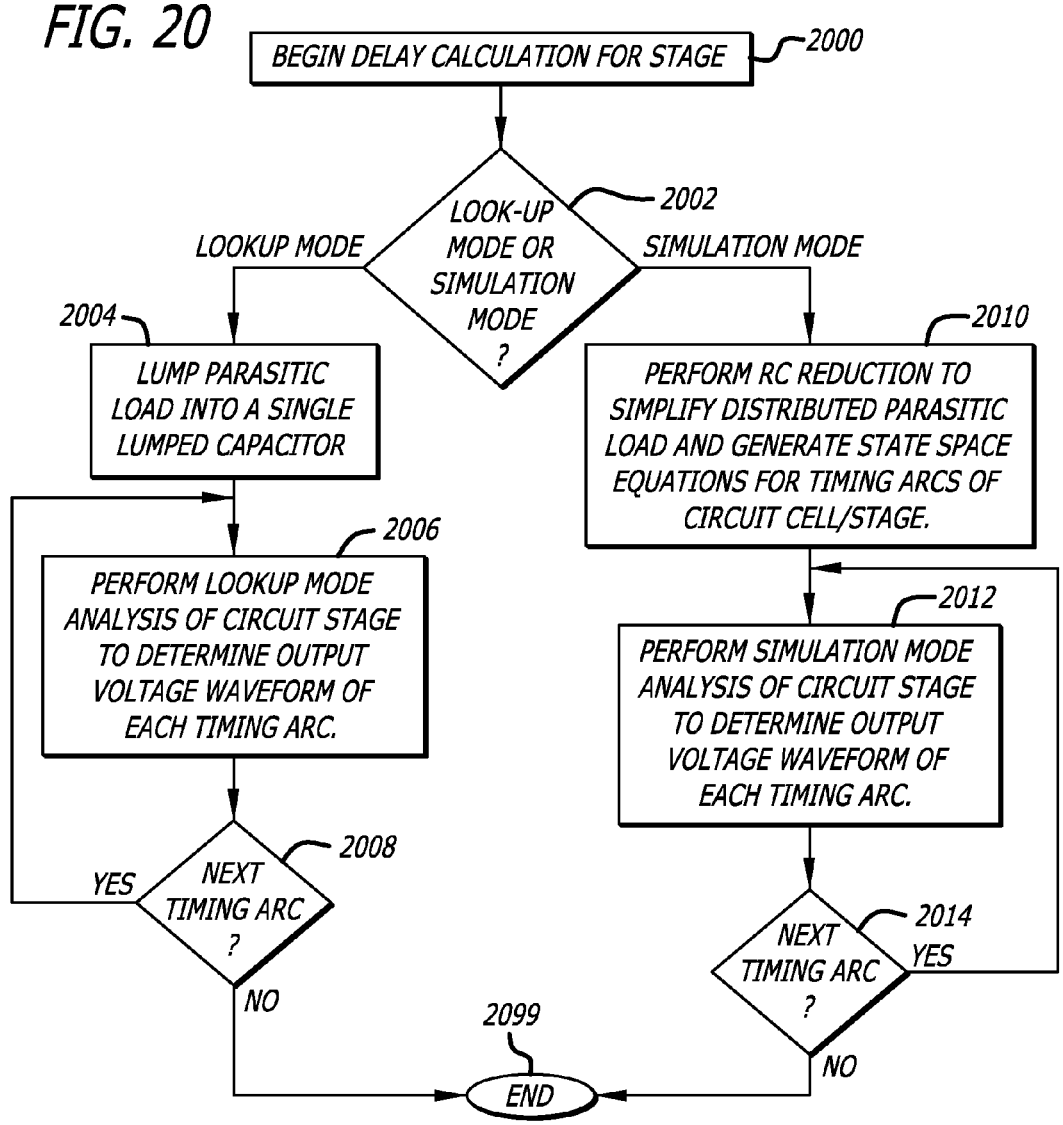
FIG. 19 illustrates a table of cutoff times for various input slew rates for the multi-stage operating region gate model.
FIG. 20 is a flowchart illustrating a delay calculation of timing arcs in a circuit cell/block using a look-up mode or a simulation mode for the multi-operating region gate model of the circuit cell/block.

FIG. 9 illustrates an exemplary table of output voltage values for the multi-operating region gate model in the steady-state region (SSR) 501. FIGS. 10A-10C illustrate exemplary tables of output voltage values, output current values, and small signal admittance for the multi-operating region gate model in the varying current region (VCR) 502. FIG. 10D is an exemplary single consolidated table of values including the values of FIGS. 10A-10C for the multi-operating region gate model in the varying current region (VCR) 502. FIG. 11A is an exemplary table of values for the multi-operating region gate model in the asymptotic region (AR) 503. FIG. 19 illustrates values of the cutoff time separating the varying current region (VCR) 502 from the asymptotic region (AR) 503 as a function of input slew rate of the input voltage Vi to a given circuit cell/stage. The values in the tables of FIGS. 10A-10D, FIG. 11A, and FIG. 19, may be obtained by characterization of each circuit cell/stage in a circuit cell library (e.g., standard cell library) as further described herein.

If in a lookup mode, the right hand side schematic/block diagram of the multi-operating region gate model illustrated in FIGS. 4A-4B are used with a lumped capacitive load $C_{lload}$. In a lookup mode, the output voltage ($V_{out}$ or $V_o$) of a circuit cell/stage may be more directly determined as the lumped capacitive load $C_{lload}$ is known. If in a simulation mode, the left hand side schematic/block diagrams of the multi-operating region gate model illustrated in FIGS. 4A-4B are used with a distributed parasitic load $RC_{dload}$. The output current ($I_{out}$ or $I_o$) is determined from the model for a distributed parasitic load $RC_{dload}$. (Note that $C_{load}$ may refer herein to either the capacitance of the $RC_{dload}$ or $C_{lload}$.) The output voltage of the stage may then be calculated with the distributed interconnect and parasitic load $RC_{dload}$ using state space equations in response to the output current. Thus, with values of each being stored, the multi-operating region gate model can be readily used to quickly determine either output voltage or output current as the need arises.

In the steady-state region (SSR) 501 for the multi-operating region gate model, the input voltage ($V_{in}$ or $V_i$) is substantially at a high DC voltage (such as the positive power supply voltage VDD) or a low DC voltage level. In response to the steady state input voltage, the output current ($I_{out}$ or $I_o$) is substantially zero and the output voltage ($V_{out}$ or $V_o$) is either substantially at a high voltage level (such as the positive power supply voltage VDD) or a low voltage level (such as the negative power supply voltage VSS, ground, or zero volts). If the number of logic inversions in a path are odd, the output voltage ($V_{out}$ or $V_o$) will be the opposite of the input voltage ($V_{in}$ or $V_i$). If the number of logic inversions in a path from input to output are odd (e.g., 1, 3, 5, etc.), the output voltage ($V_{out}$ or $V_o$) will be substantially the opposite of the input voltage ($V_{in}$ or $V_i$). This is represented by the values of Vdd and 0 in the steady state table illustrated in FIG. 9 under the output voltage column $V_o'$. If the number of logic inversions in a path from input to output are even (e.g., 2, 4, 6, etc.), the output voltage ($V_{out}$ or $V_o$) will be the substantially the same as the input voltage ($V_{in}$ or $V_i$). This is represented by the values of 0 and Vdd in the steady state table illustrated in FIG. 9 under the output voltage column $V_o$.

Model Characterization

The multi-operating region gate model is characterized from a blackbox view of a standard circuit cell/stage. Each standard circuit cell/stage of a standard cell library are characterized to generate a new standard cell library as part of a library characterization design flow. The new standard cell library including circuit cells/stages characterized with the multi-operating region gate model may be used in timing and noise analyses during IC design implementation and IC design sign-off.

Generally, the multi-operating region gate model for the VCR region is a time and output voltage variant current source model. For the VCR region, it may include multiple sets of two dimensional tables (such as those in FIGS. 10A-10C, each being a three dimensional table), one set for output current $I_o(t, v_o)$ with a table for each input slew rate $\sigma_m$. Alternatively, the multiple sets of tables (including one for each input slew rate) may be compacted into a single set of two dimensional tables, such as that shown in FIG. 10D. The number of input slew rates may be on the order of ten for example.

Generally, the multi-operating region gate model for the AR region is a time-invariant current model. For the AR region, it may include a cutoff time table $t_{cutoff}(\sigma_m)$ as a function of slew rate (FIG. 19), small signal admittance $G_z$, and a time-invariant current table $Io(v_o)$ (FIGS. 11A-11B).

The model includes a list of lumped capacitive loads and a list of input slews $\sigma_k$ used to characterize each circuit cell/stage. For each input slew $\sigma$, the model further includes a list of time points defining the time grid in the VCR region and the cutoff time defining the range of the VCR region separating it from the AR region. If the output voltage $V_{out}$ is fixed to a constant value in the VCR region, the output current depends upon time. At each time point in the VCR region for each input slew and output load, a list of triple data points, output voltage V0, output current Io, and small signal admittance g, are recorded. In the AR region, the asymptotic I(V) curve is characterized by a list of $\{t_z, V_z, I_z, G_z\}$ at points Z.

The input pin capacitance $C_{in}(V_{in}, Cload)$; a function of input voltage, capacitive load, and possibly input slew; is characterized in both the AR region and the VCR region.

Generally, to characterize multi-operating region gate model, the voltage and current waveforms at inputs and outputs of the standard circuit cell/stage are observed to generate lookup tables for the VCR operating region (FIGS. 10A-10D) and the AR operating region (11A). However, the data needed for representing the output responses can be reduced to provide a more compact model.

Transient simulations are performed on each cell of a cell library using a SPICE (Simulation Program with Integrated Circuit Emphasis) transistor circuit simulator. Each cell of a cell library is instantiated in a SPICE deck multiple times with each instance driving a different lumped load. The multiple SPICE decks may be concurrently simulated together by a SPICE simulator so that voltages and currents at various time points (predefined by the time grid and/or internally used by circuit simulator) are measured. The concurrent SPICE simulation of multiple SPICE decks of each circuit cell allows currents to be measured at different voltages at the same time. Additionally, with all capacitance loads being simulated with SPICE concurrently, the time to simulate each cell is less so that it is more efficiently characterized. Moreover, as currents and voltages are measured at the same time points in the time grid in a unified manner, simulation is less costly and can be robust.

The time points from the device-level simulation internally used by the circuit simulator may be pruned. The data may be stored in a cell library using liberty extension (.lib) format. Additionally, data may be pruned at time points when the output current at a fixed voltage is a constant. In this manner, the data representing the multi-operating region gate model in a cell library may be compacted.

In characterizing the VCR region, detailed data is stored up to the cutoff time $t_{cutoff}$. After the cutoff time $t_{cutoff}$, detailed data points for output current $I_o(t>t_{cutoff}, v_o)$, small signal admittance, and output voltage $V_o$ as a function of time is no longer needed with the AR region being characterized. This makes it possible to compact the data stored to represent the multi-operating region gate model significantly.

In the AR region 503, the asymptotic transition may be fully captured by measuring (time, voltage, and current values) for one or two very large output capacitive loads. After the input transition saturates, the asymptotic transition can be used to accurately construct the portion of the output response in the AR region.

Figure 15:
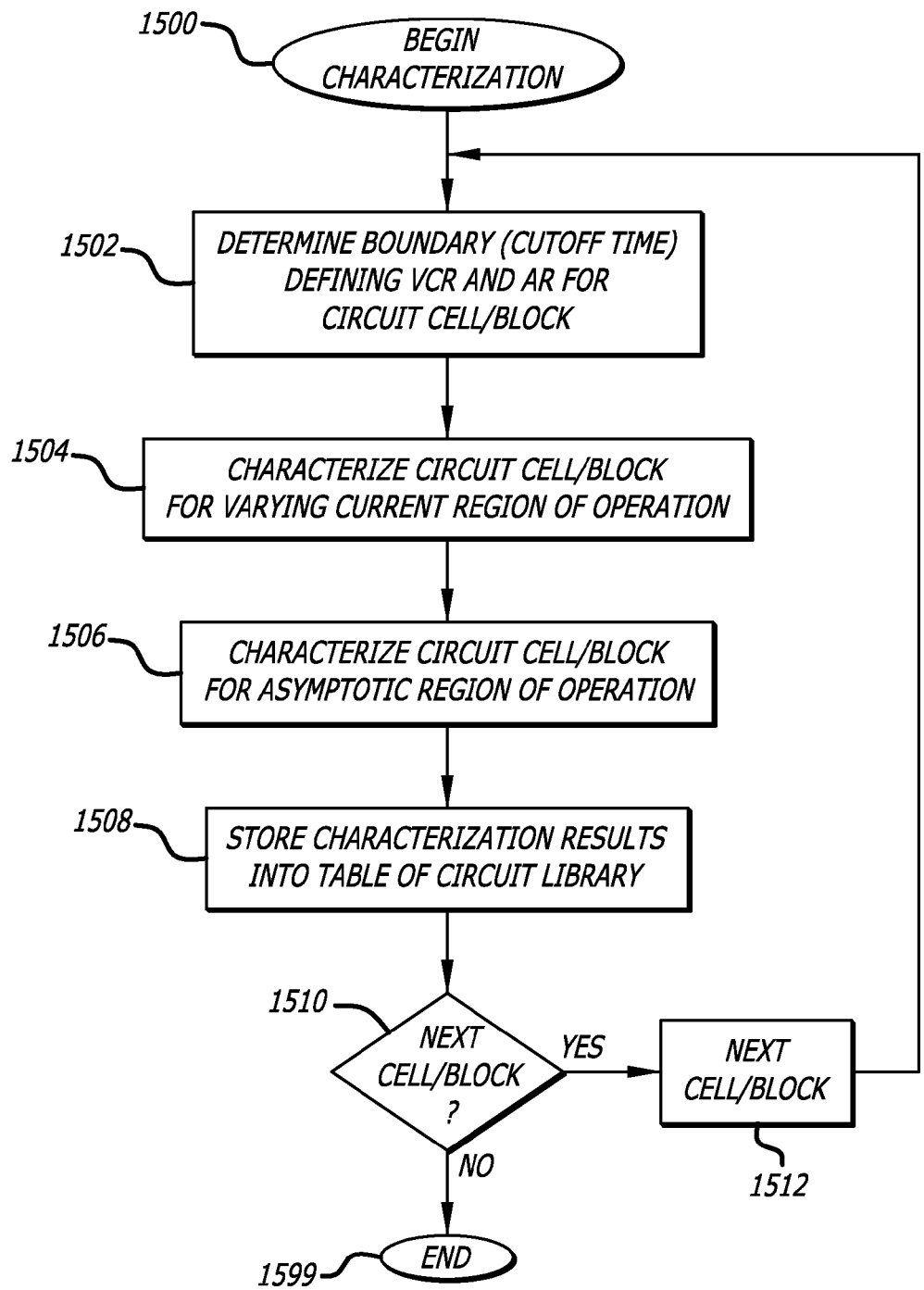
FIG. 15 illustrates a flow chart diagram for characterizing the multi-operating region gate model of the circuit under test.

Referring now to FIG. 15, a flow chart diagram generally illustrating a method for characterizing the multi-operating region gate model of each circuit cell/stage of a cell library. The process begins at block 1500 and goes to block 1502.

At block 1502, for each input slew rate, the cutoff time is determined to define the VCR and AR operating regions for the circuit cell/stage. The process then goes to block 1504.

At block 1504, the circuit cell/stage is characterized for the VCR operating region. The process then goes to block 1506.

At block 1506, the circuit cell/stage is characterized for the AR operating region. The process then goes to block 1508.

Alternatively, the AR and VCR operating regions may be characterized concurrently (parallel) together, or the AR operating region may be characterized first with the VCR operating region characterized there-after.

At block 1508, the characterization results are stored into tables of a cell library associated with the circuit cell/stage. The process then goes to block 1510.

At block 1510, a determination is made if there are any further circuit cells/stages to characterize. If not, the process goes to block 1599. If so, the process loops back and goes to block 1512.

At block 1512, the next circuit cell/stage is selected for characterization. The process then goes back to repeat block 1502.

At block 1599, the process ends.

Figure 12:
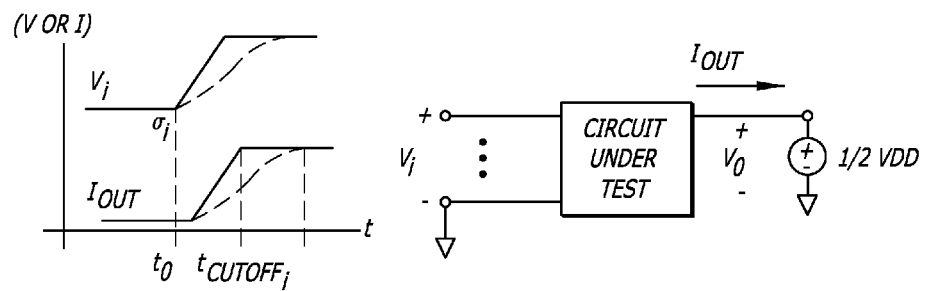
FIG. 12 illustrates a schematic/block diagram to characterize the cutoff time for the multi-operating region gate model of a circuit under test.

FIG. 12 illustrates a schematic/block diagram to characterize the cutoff time for the multi-operating region gate model of a circuit under test.

Referring now to FIG. 12, FIG. 16, and FIG. 19, each circuit cell/stage of a cell library is characterized for cutoff times of the multi-operating region gate model. FIG. 12 illustrates a schematic/block diagram to characterize the cutoff time. FIG. 19 illustrates a table of cutoff times for the multi-stage operating region gate model in response to various input voltage slew rates. FIG. 16 illustrates a flow chart diagram, for each circuit cell/stage, to characterize the cutoff time of the multi-operating region gate model.

In FIG. 16, the process begins with block 1502 and goes to block 1604.

At block 1604, a constant voltage supply is applied to the output of the circuit cell/stage under test to hold the output voltage V0 midway between the positive power supply voltage VDD and the negative power supply voltage GND (e.g., zero volts), or one half of the positive power supply voltage VDD. The process then goes to block 1606.

At block 1606, an input ramp voltage Vi is applied to the input of the circuit cell/stage with the given predetermined input voltage slew rate and the output current from the circuit cell/stage into the constant voltage supply is measured. The process then goes to block 1608.

At block 1608, after the input ramp voltage Vi reaches a steady state (e.g., the positive power supply voltage VDD or negative power supply voltage—zero volts), the cutoff time is determined from the start of the input ramp voltage $t_o$ to the time when the output current insubstantially changes after the input ramp voltage reaches the steady state. The process goes to block 1610.

At block 1610, the measured time is stored in the table of FIG. 19 as the cutoff time for the given slew rate. The process then goes to block 1620.

At block 1620, a determination is made if there is any further input voltage slew rate for which the cutoff time is to be characterized. If so, the process goes to block 1622. If not, the process goes to block 1698.

At block 1622, the next input voltage slew rate is selected and the process loops back to block 1606 and repeats the loop.

At block 1698, the process returns to block 1504 of FIG. 15.

Figure 14:
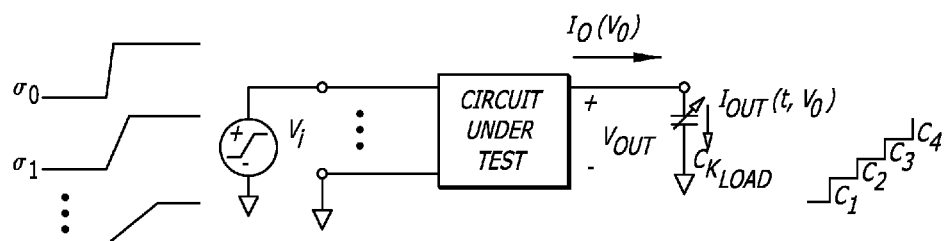
FIG. 14 illustrates a schematic/block diagram to characterize the output current and output voltage of the VCR region for the multi-operating region gate model of the circuit under test.
Figure 17A:
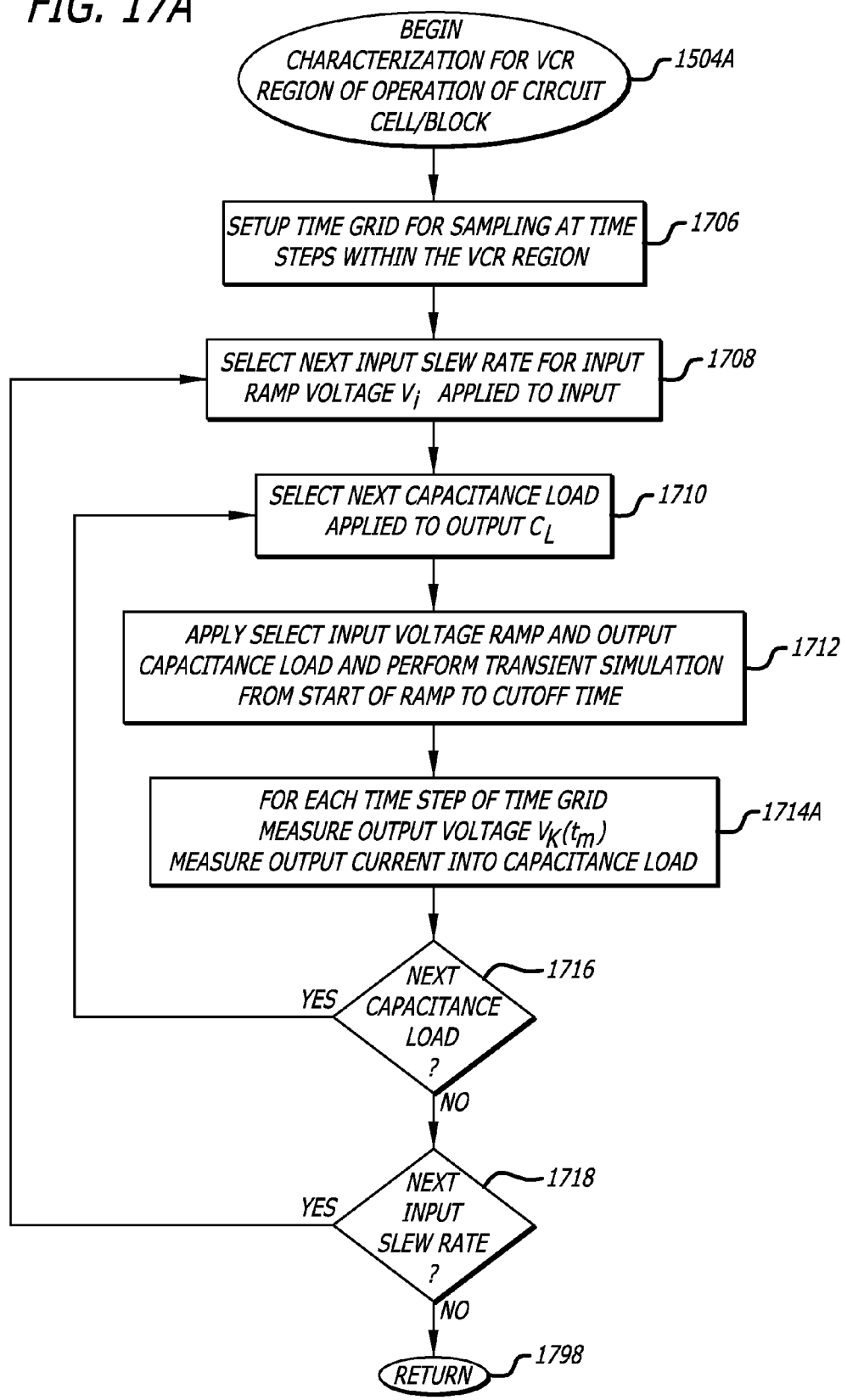
FIG. 17 illustrates a flow chart diagram for characterizing the output current and output voltage of the AR region for the multi-operating region gate model of the circuit under test.
Figure 17B:
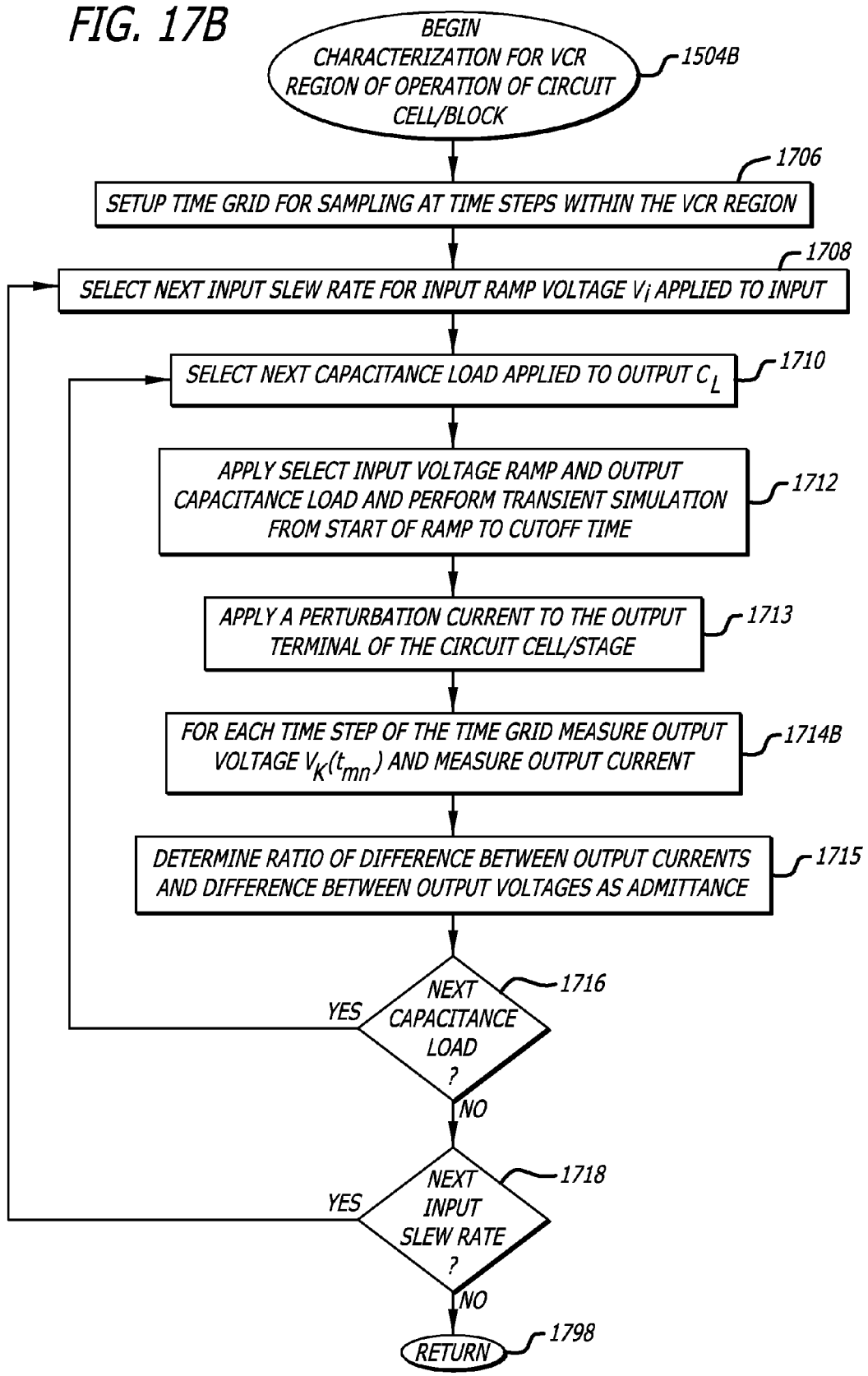

Referring now to FIG. 14, FIGS. 23A-23B, FIGS. 17A-17B, and FIGS. 10A-10C, each circuit cell/stage of a cell library is characterized for the VCR operating region of the multi-operating region gate model. FIG. 14 illustrates a schematic/block diagram to characterize the VCR operating region of the multi-operating region gate model. FIGS. 10A-10C respectively illustrate three dimensional tables of output voltage, output current, and small signal admittance for the VCR region of the multi-stage operating region gate model in response to various input voltage slew rates and output capacitive loads. FIGS. 17A-17B illustrates a flow chart diagram, for each circuit cell/stage, to characterize the VCR region of the multi-stage operating region gate model.

In FIGS. 17A-17B, the characterization of the VCR region begins with blocks 1504A-1504B for the given circuit cell/stage. The process then goes to block 1706.

At block 1706, a time grid is setup for characterizing (e.g., sampling output voltage and output current) the given circuit cell/stage at time steps within the VCR operating region. FIG. 5 illustrates a time grid with time steps from $t_1$ to $t_{cutoff}$ in the VCR region after the offset time $t_{offset}$, for example. While the time grid in the VCR region (FIG. 5) appears to be a uniform grid with equal time steps, the grid may be non-uniform as well with unequal time steps. Whether uniform or non-uniform, the same time grid is to be used to characterize each circuit cell of the cell library. The process goes to block 1708.

At block 1708, the next input slew rate for the input ramp voltage Vi is selected that is to be applied to the input terminal. The process then goes to block 1710.

At block 1710, the next capacitance load $C_L$ for the output terminal is selected. The process then goes to block 1712.

At block 1712, the selected input voltage ramp is applied to the input terminal and the output capacitance load is applied to the output terminal and a transient simulation (e.g., SPICE simulation) is performed from the start of the ramp to the cutoff time. The process goes to block 1714.

At block 1714A, for each time step of the time grid, the output voltage $V_k(t_n)$ across the output capacitance load is measured and the output current $I_k(V_k, t_n)$ into the output capacitance load is measured. The process then goes to block 1716.

At block 1716, a determination is made if there are further output capacitance loads to be simulated to characterize the cell/stage. If so, the process loops back to process block 1710. If there are no further output capacitance loads to be simulated, the process goes to process block 1718.

At block 1718, a determination is made if there are further input slew rates to be simulated to characterize the cell/stage. If so, the process loops back to process block 1708. If not, the process goes to block 1798.

At block 1798, the process returns to block 1506 of FIG. 15.

Referring now to FIG. 17B, FIGS. 23A-23B, and FIG. 10C, the small signal admittance is characterized in the VCR region. The process begins with block 1504B and goes to block 1706.

At block 1706, a time grid is setup for characterizing (e.g., sampling output voltage and output current) the given circuit cell/stage at time steps within the VCR operating region. FIG. 5 illustrates a time grid with time steps from $t_1$ to $t_{cutoff}$ in the VCR region after the offset time $t_{offset}$, for example. While the time grid in the VCR region (FIG. 5) appears to be a uniform grid with equal time steps, the grid may be non-uniform as well with unequal time steps. Whether uniform or non-uniform, the same time grid is to be used to characterize each circuit cell of the cell library. The process goes to block 1708.

At block 1708, the next input slew rate for the input ramp voltage Vi is selected that is to be applied to the input terminal. The process then goes to block 1710.

At block 1710, the next capacitance load $C_L$ for the output terminal is selected. The process then goes to block 1712.

At block 1712, the selected input voltage ramp is applied to the input terminal and the output capacitance load is applied to the output terminal and a transient simulation (e.g., SPICE simulation) is performed from the start of the ramp to the cutoff time. The process goes to block 1713.

At block 1713, a small perturbation current is applied by a constant current source coupled to the output terminal in parallel with the output capacitance load. It is expected that the small perturbation current slightly alters the output voltage and output current from the circuit cell/stage than without. The process then goes to block 1714B.

At block 1714B, for each time step of the time grid, the output voltage $V_k(t_n)$ across the output capacitance load is measured and the output current from the circuit cell/stage is measured. The process then goes to block 1715.

At block 1715, a ratio g between the difference in measured output current (from blocks 1714A-1714B) and the difference in measured output voltage (from blocks 1714A-1714B) is determined to generate the small signal admittance for the given output load and input slew rate for the given time step.

$$g = \frac{\Delta I}{\Delta V} = \frac{I_{out1} - I_{out2}}{V_{out1} - V_{out2}}.$$

The process then goes to block 1716.

At block 1716, a determination is made if there are further output capacitance loads to be simulated to characterize the cell/stage. If so, the process loops back to process block 1710. If there are no further output capacitance loads to be simulated, the process goes to process block 1718.

At block 1718, a determination is made if there are further input slew rates to be simulated to characterize the cell/stage. If so, the process loops back to process block 1708. If not, the process goes to block 1798.

At block 1798, the process returns to block 1506 of FIG. 15.

In FIGS. 17A-17B, the characterization process elements of the VCR may be performed in parallel in one transient simulation by including a plurality of SPICE decks with a plurality of circuit cells/stages with the combination of different input slew rates, different output capacitance loads, and with/without the perturbation current. Furthermore, small signal admittance in the AR region may be similarly characterized using transient simulations with and without a perturbation current. However, a single output capacitance load and a single input voltage slew rate may be used to determine the small signal admittance by determining the ratio g between the difference in measured output current over the difference in output voltage.

Figure 13:
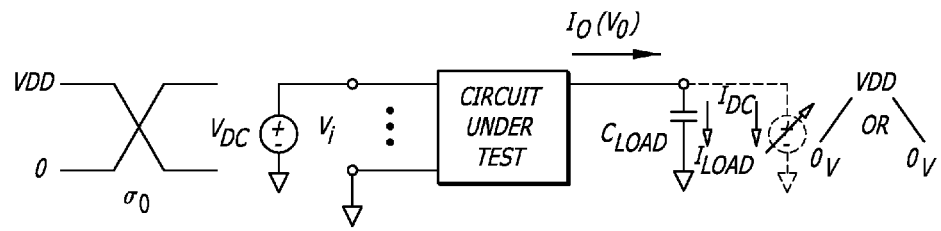
FIG. 13 illustrates a schematic/block diagram to characterize the output current and output voltage of the AR region for the multi-operating region gate model of the circuit under test.

Referring now to FIG. 13, FIG. 18A, and FIG. 11A, each circuit cell/stage of a cell library is characterized for the AR operating region of the multi-operating region gate model. FIG. 13 illustrates a schematic/block diagram to characterize the AR operating region of the multi-operating region gate model. FIG. 11A illustrates a table including, time, output voltage, output current, and small signal admittance for the AR region of the multi-stage operating region gate model in response to a capacitive load. FIG. 18A illustrates a flow chart diagram, for each circuit cell/stage, to characterize the AR region of the multi-stage operating region gate model.

For simulation times greater than the cutoff time, $t > t_{cutoff}$, the output current is a function of output voltage, $I_1(v_o)$. During characterization, the output current, small-signal admittance and output capacitance are obtained directly from measurements rather than being computed numerically from voltage responses. Direct measurement is numerically more robust than making numerical computations to obtain model values. The AR region may be characterized in a couple of ways.

In FIG. 18A, one method of characterization for the AR region is illustrated. The AR characterization process begins at block 1506A and goes to block 1802.

Figure 7:
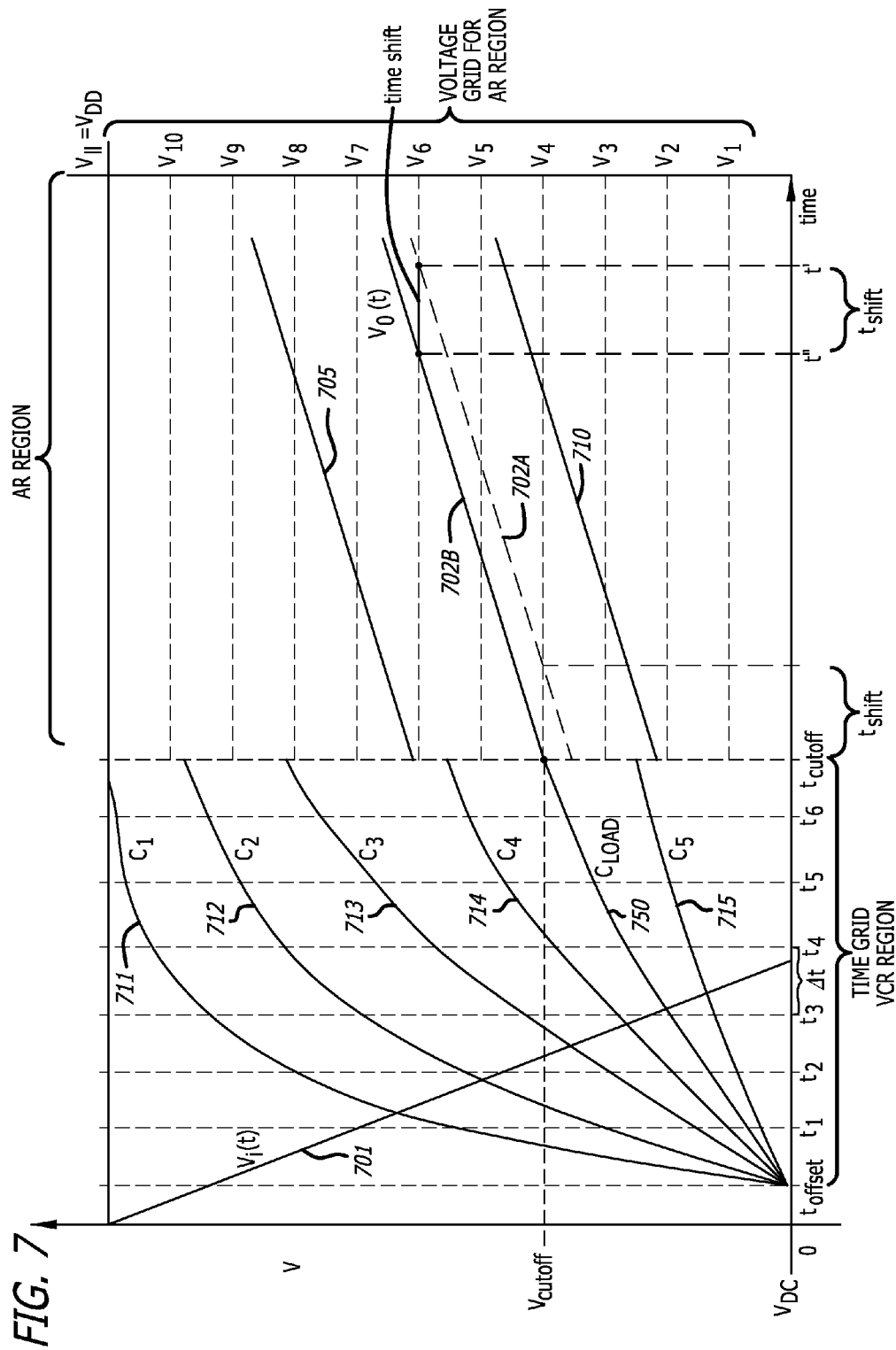
FIG. 7 illustrates characteristic curves and interpolated curves to determine output voltage over time in a look up mode.

At block 1802, a voltage grid of voltage steps in the AR region is formed. FIG. 7 illustrates a voltage grid of voltage steps $V_1$ to $V_{11}$ in the AR region, for example. While the voltage grid in the AR region (FIG. 7) appears to be a uniform grid with equal voltage steps, the voltage grid may be non-uniform as well with unequal voltage steps. Whether uniform or non-uniform, the same voltage grid is to be used to characterize each circuit cell of the cell library. The voltage grid of voltage steps will be used throughout to measure current and time for a given circuit cell/stage. For example, a voltage grid may vary from a high level voltage (e.g., the positive power supply voltage) to a low voltage level (e.g., zero volts). The voltage steps may be ten-tenths of the positive power supply voltage (VDD), nine-tenths of the positive power supply voltage (0.9VDD), eight-tenths of the positive power supply voltage (0.8VDD), . . . , and one-tenth of the positive power supply voltage (0.1 VDD). After establishing the voltage grid, the process then goes to bock 1804.

At block 1804, a first large reference capacitance load is applied to the output of the given circuit cell/stage. The process then goes to block 1806.

At block 1806, an input voltage source Vi is applied to the input of the circuit cell/stage having a small input voltage slew rate to quickly transition the input from a low level (e.g., negative power supply level—zero volts) to a high level (e.g., positive power supply level VDD) or from a high level to a low level, depending upon what causes the output to transition. The process then goes in parallel to blocks 1810A and 1808.

Figure 23A:
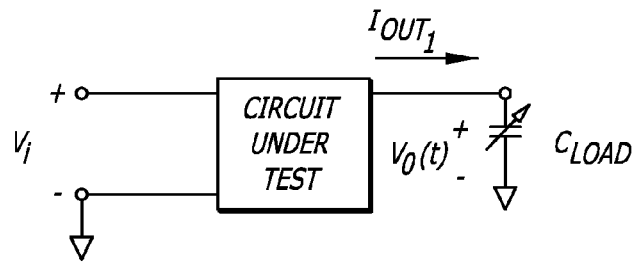
FIGS. 23A-23C illustrate schematic/block diagrams to characterize the small signal admittance of the output for the multi-operating region gate model of the circuit under test.
Figure 23B:
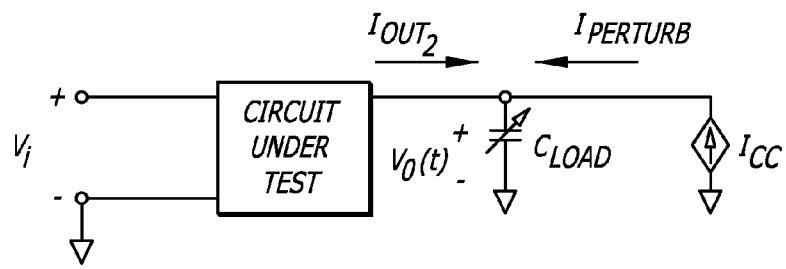

At block 1808, a constant current source is coupled to the output terminal to apply a perturbation current to the circuit cell/stage as shown in FIG. 23B. The process then goes to block 1810B.

At blocks 1810A-1810B, a transient (AC) simulation is performed on the circuit cell/stage extending well beyond the cutoff time into the AR region of the circuit cell/stage. The process goes to blocks 1814A-1814B, where measurements are to be taken.

At blocks 1814A-1814B, at voltage steps of a voltage grid, time points are measured to reach each voltage step and output currents out from the circuit cell stage are measured at each voltage step for the voltage grid in the AR region. The measurements may be stored into two tables as shown by FIG. 11A with non-linear interpolation being used to generate an appropriate table of values for a given output load. Alternatively, the measurements may be stored in a single table such as shown by FIG. 11B. The measured time points may be normalized by the capacitive load that was applied (time divided by the first reference capacitance load or the second reference capacitance load). This enables the measured time points to be properly compared. After the measuring time and output current on the voltage grid, the process then goes to block 1816.

At block 1816, a determination is made as to whether or not the given circuit cell/stage of a library has been simulated with two output capacitance loads to characterize the circuit cell/stage in the AR region. If not, the process goes to block 1818. If so, the process goes to block 1820.

At block 1818, a second large reference capacitance load (e.g., twice the first large reference capacitance load) is applied to the output of the given circuit cell/stage. The process then loops back to block 1806 and repeats steps 1810A, 1814A, and 1816.

At block 1820, the small signal admittance g is determined for the circuit cell/stage in the AR region. The small signal admittance g may be determined from a ratio of the difference in measured output current (e.g., perturbed output current at voltage step 1 ($V_{out1}$) less non-perturbed output current at voltage step 2 ($V_{out2}$)) over a difference in output voltage between the perturbed and non-perturbed simulations.

$$g = \frac{\Delta I}{\Delta V} = \frac{I_{out1} - I_{out2}}{V_{out1} - V_{out2}}.$$

In this case, the output voltage Vout1 and Vout2 are voltages measured at the same time point in the AR region with and without the perturbation current. The computations for small signal admittance may be stored in both tables of FIG. 11A or the lone table of FIG. 11B. The process then goes to block 1898.

At block 1898, the process returns to the overall characterization process of FIG. 15.

In FIG. 18B, an alternate method of characterization of a circuit cell/stage for the AR region is illustrated. The alternate AR characterization process begins at block 1506B and goes to block 1802.

At block 1802, a voltage grid of voltage steps in the AR region is formed. The voltage grid of voltage steps will be used throughout to measure current and time for a given circuit cell/stage. For example, a voltage grid may vary from a high level voltage (e.g., the positive power supply voltage) to a low voltage level (e.g., zero volts). The voltage steps may be ten-tenths of the positive power supply voltage (VDD), nine-tenths of the positive power supply voltage (0.9VDD), eight-tenths of the positive power supply voltage (0.8VDD), . . . , and one-tenth of the positive power supply voltage (0.1VDD). After establishing the voltage grid, the process then goes to bock 1830A.

At block 1830A, a constant voltage source is applied to the input of the circuit cell/stage to hold the input voltage Vi to a final steady state level (e.g., positive power supply level VDD or negative power supply level—zero volts). The process then goes to block 1832A.

At block 1832A, a first voltage source is applied to the output and a direct current (DC) simulation is performed on the circuit cell/stage with the output voltage being swept from a low voltage level to a high voltage level or from the high voltage level to the low voltage level with the input voltage set to the final steady state level such as shown by FIG. 13. The process then goes to block 1834A, where measurements are to be taken during the output voltage sweep.

At block 1834A, at voltage steps $V_{out1}$ of the voltage grid, time is measured to reach each voltage step and output current $I_{out1}$ (without perturbation) is measured out of the circuit cell/stage at each voltage step. The process then goes to block 1838.

Figure 23C:
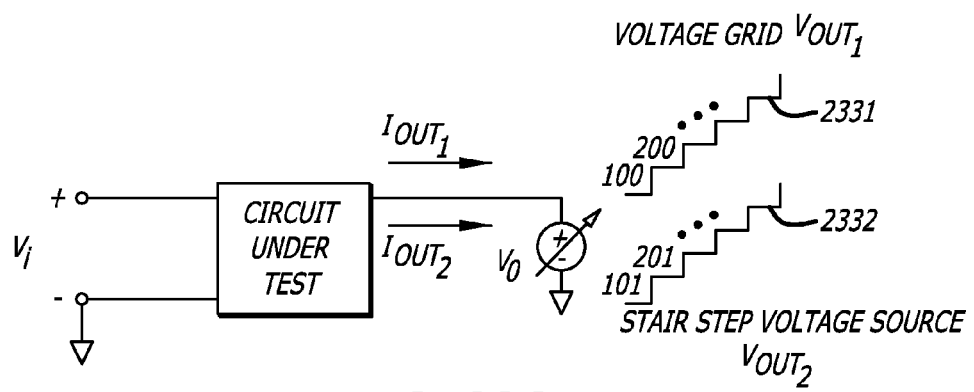

At block 1838, a stair step voltage source (a second voltage source differing from the first) is coupled to the output terminal as shown in FIG. 23C to apply at least one perturbation voltage step to the circuit cell/stage. The voltage steps of the voltage grid in the AR region may be referred to as grid voltage steps to distinguish from perturbation voltage steps. The at least one perturbation voltage step has a voltage level near a voltage level of a grid voltage step. That is, the perturbation voltage steps are slightly offset from the voltage steps of the voltage grid, such as shown by the waveform 2331 for the grid voltage steps $V_{o1}$ (e.g., 100 mv, 200 mv) and the output voltage waveform—2332 for the perturbation voltage steps $V_{o2}$ (e.g., 101 mv, 201 mv). The process then goes to block 1830B.

At block 1830B, a constant voltage source is applied to the input of the circuit cell/stage to hold the input voltage Vi to a final steady state level (e.g., positive power supply level VDD or negative power supply level—zero volts). The process then goes to block 1832B.

At block 1832B, with the perturbation voltage being applied at perturbed voltage steps by the stair step voltage source, a direct current (DC) simulation is executed to find the modified output current $I_{out2}$ associated with the perturbed voltage steps $V_{out2}$. The process then goes to block 1834B.

At block 1834B, the modified output current $I_{out2}$ is measured out of the circuit cell/stage at each perturbed voltage step applied by the applied perturbation voltage source.

At block 1840, the small signal admittance g is determined for the circuit cell/stage in the AR region. The small signal admittance g may be determined from the perturbed and non-perturbed DC simulations by taking a ratio of the difference in measured output current (e.g., modified output current $I_{out2}$ at a perturbed voltage step $V_{out2}$ less the output current $I_{out1}$ measured at a corresponding voltage step $V_{out1}$ of the voltage grid without the perturbed voltage step) over a difference in the output voltage (e.g., the difference between the perturbation voltage step provided by the stair step voltage and the voltage step of the voltage grid). For example, the grid voltage steps of the voltage grid may be every 100 millivolts (mv), such as 100 mv and 200 mv while the perturbation voltage steps of the stair step voltage source may be 101 mv and 201 mv respectively. The following equation is representative of finding the small signal admittance for the circuit cell/stage in the AR region:

$$g = \frac{\Delta I}{\Delta V} = \frac{I_{out1} - I_{out2}}{V_{out1} - V_{out2}}.$$

The computations for small signal admittance may be stored in both tables of FIG. 11A or the lone table of FIG. 11B. The process then goes to block 1898.

At block 1898, the process returns to the overall characterization process of FIG. 15.

The input pin capacitance of each circuit cell/stage for both the VCR region and the AR region can be characterized by known techniques.

Delay Calculations with a Multi-Operating Region Gate Model

The multi-operating region gate model may be used with a delay calculator to analyze the timing of a circuit cell/stage in a signal path of an integrated circuit. The multi-operating region gate model for a give circuit cell/stage is read from a cell library data base and loaded into memory to be used for delay calculations. The delay may be computed by solving a set of ordinary differential equations with a nonlinear current source being defined by the multi-operating region gate model. The current and it's derivatives determined by the multi-operating region gate model are physically sound allowing for fast and accurate calculations. The robust current values also allow for accurate noise calculation.

With a distributed load, the output voltage response of a circuit in the VCR operating region may be determined by numerically solving state space equations using the output current generated by a current source as a function of time and voltage up until the cutoff time. In the AR operating region (outside the VCR operating region) with simulation time past the cutoff time, the output current is asymptotic as a function of voltage regardless of the simulation time. The voltage response may be determined by numerically solving state space equations using the asymptotic output current generated by a current source as a function output voltage. In the VCR region, the output current $I_{out}$ and the small signal admittance G may be interpolated with regards to time and voltage.

With a lumped load, the output voltage response may be looked up and interpolated from tables characterizing the waveform responses. In the AR operating region (outside the VCR operating region) with simulation time past the cutoff time, the output current is asymptotic as a function of voltage regardless of simulation time past the cutoff time. A table representing a response curve in the AR region may scaled to match the output loading of a given circuit cell/stage. In the AR region, the output response can be determined with little loss of accuracy from the asymptotic transition using an appropriate stretching of time values.

Referring now to FIG. 20, a flowchart illustrates a method of delay calculation of timing arcs in a circuit cell/block of a stage using a look-up mode or a simulation mode for the multi-operating region gate model of the circuit cell/block/stage.

Figure 25:
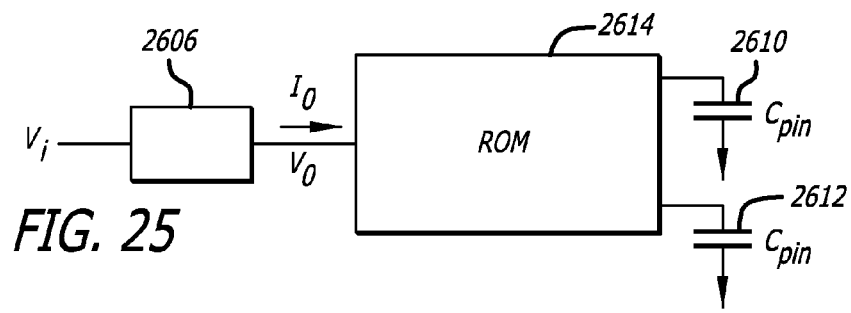
FIG. 25 illustrates a block diagram of how the circuit stage of FIG. 24 may be modeled.

In FIG. 25, an exemplary stage 2500 is illustrated for which a delay calculation may be made. Each stage of a circuit may have a logic gate, such as a buffer or driver 2506, with some interconnect 2514 to couple the output of the driver to one or more receiving logic gates, such as an inverters 2510-2512. The exemplary stage 2400 includes a driver 2506 and a distributed load network 2514 including parasitic resistances Rp and parasitic capacitances Cp coupled to two receivers 2510, 2512.

In operation, the driver 2506 receives an input signal vi and drives an output signal onto the net 2516. The signal on the net 2516 is propagated through the interconnect network 2514 to respective input nodes 2518, 2520 of receivers 2510, 2512. It will be appreciated that in order to avoid obscuring this disclosure in unnecessary detail, only a single interconnect network 2514 is shown driven by a single driver 2506 connected to two receivers 2510, 2512, although several drivers, interconnect networks with more than one or more receivers may be implemented.

The delay calculation through a stage may be affected by the input slew rate of the input signal vi. In one embodiment, rising edge slew rate may be defined as time required for a rising signal to transition from 20% of supply voltage (Vdd) to 80% of Vdd, divided by 0.6. Similarly, the falling edge slew rate may be defined in one embodiment as time required for a falling signal to transition from 80% of Vdd to 20% of Vdd, divided by 0.6.

Each stage of a circuit may be modeled for delay calculations to reduce the run time in determining timing delays in delay paths.

Figure 24:
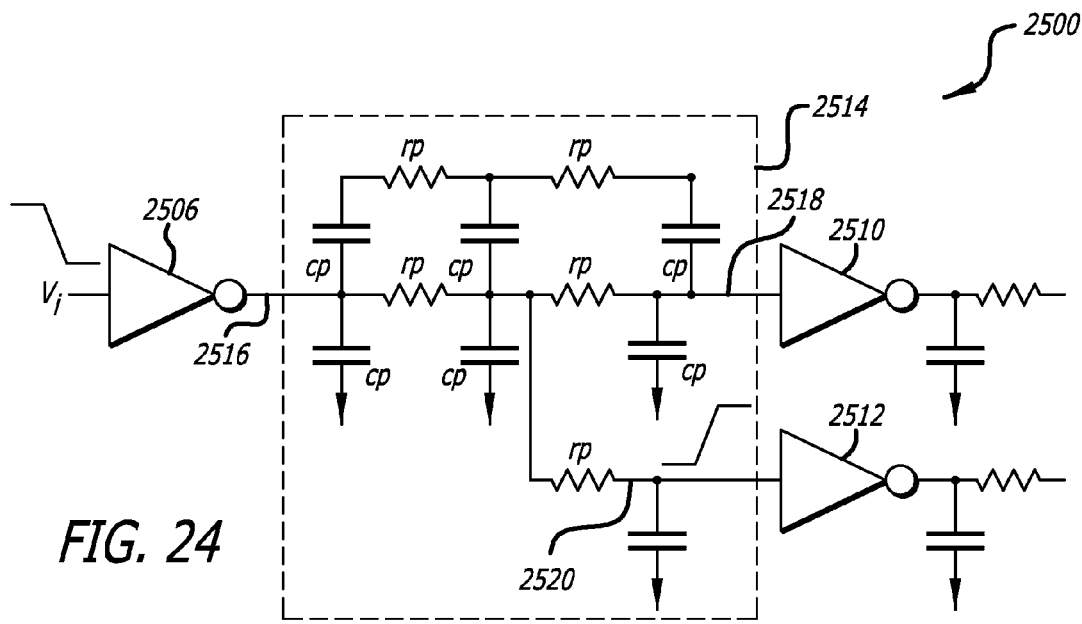
FIG. 24 illustrates a schematic diagram of a circuit stage including a driver coupled to an interconnection network with a distributed load to drive one or more receivers.

FIG. 25 illustrates a modeled circuit stage that may be used to model each stage of a circuit. For example, the driver 2506 illustrated in FIG. 24 can be modeled by the multi-operating region gate model 2606. The interconnect network 2514 illustrated in FIG. 24 can be modeled by a reduced-order model (ROM) 2614 for interconnect. U.S. Pat. No. 7,359,843 issued on Apr. 15, 2008 to inventors Igor Keller, et al., entitled ROBUST CALCULATION OF CROSSTALK DELAY CHANGE IN INTEGRATED CIRCUIT DESIGN, incorporated by reference, generally describes how the interconnect network 2514 may be modeled with a reduced order model. The input load of the one or more receiving logic gates 2510, 2512 may be respectively modeled by one or more capacitors 2610,2612.

With little or no parasitic resistance, the interconnect network 2514 and the input load of a receiving gate 2510,2512 may be modeled by lumping the capacitances together into a lumped capacitive load coupled to the output of the multi-operating region gate model 2606. With a lumped capacitive load, a lookup analysis mode may be used with the multi-operating region gate model.

The delay of each stage is computed inside a loop over cell timing arcs or edges of a timing or design graph, and included into the full timing delay that may be passed on to a static timing analysis tool. The delay calculation is performed by a delay calculator in such a way that the timing delay of logic gates and interconnect of each stage are computed concurrently together.

To compute delay, the delay/SI calculator 102 in FIG. 1A works on a net level abstraction. It deals with computing the signal propagation delay through each edge or timing arc of a design or timing graph. Typically, the computation is performed for a set of related edges, where all the edges are formed based on a cell driving a net. The set of related edges is often referred to as a stage. The delay/SI calculator creates an electrical view of a stage and then computes all required electrical calculations on this stage by performing appropriate electrical simulations.

Figure 26:
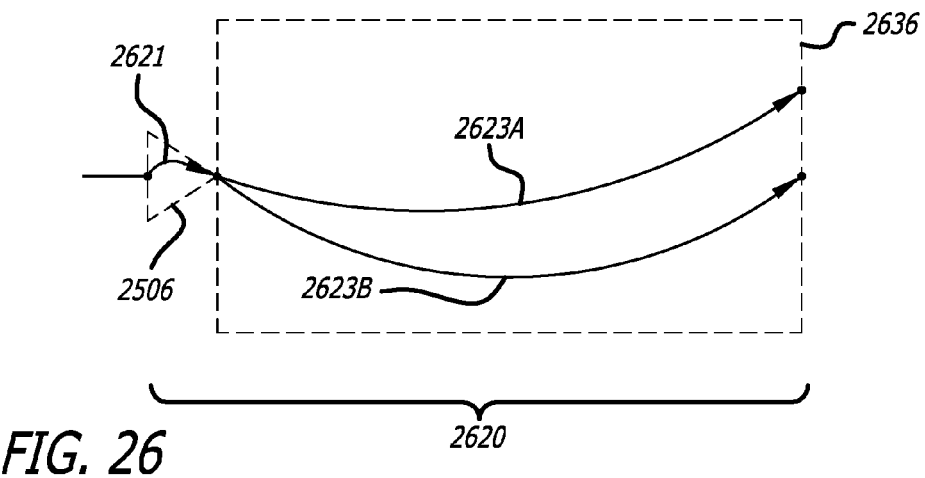
FIG. 26 illustrates a timing subgraph of a timing graph with timing arcs associated with the circuit stage of FIG. 24.

Referring now to FIG. 26, an exemplary portion of a design or timing graph, a subgraph 2620 corresponding to a circuit stage is illustrated. The subgraph 2620 and the overall timing graph includes a driver based timing arc 2621 associated with a driver 2506 and interconnect based timing arcs 2623A, 2623B (collectively timing arcs 2636) associated with the interconnect network 2514 and capacitance input pin load from each driver 2506 to each input of the receivers 2510, 2512. Complete signal paths from a first input pin of a first stage to a second input pin of a second stage may be analyzed for each circuit stage. FIG. 26 illustrates two signal paths, for example. A first signal path includes the driver based timing arc 2621 and the interconnect based timing arc 2623A, for example. A second signal path includes the driver based timing arc 2621 and the interconnect based timing arc 2623B, for example.

Referring now back to FIG. 20, a delay calculation of the circuit stage may be made starting at block 2000 which then goes to block 2002. Delay calculations of a circuit stage may be made using the multi-operating region gate model in a look-up mode or a simulation mode. The look-up mode or simulation mode may be selected by a user.

At block 2002, a determination is made as to whether the look-up mode or the simulation mode has been selected. If the look-up mode has been selected, the process goes to block 2004. If the simulation mode has been selected, the process goes to block 2010.

At block 2004, assuming look-up mode, the interconnect network 2514 and the receiver input load is lumped into a single lumped capacitor load. The process then goes to block 2006.

At block 2006, a lookup mode analysis of the circuit stage is performed to determine the output voltage waveform for each timing arc. The process then goes to block 2008.

At block 2008, a determination is made if there are further timing arcs to analyze. If there are further timing arcs to analyze, the process loops back to block 2006. If there are no further timing arcs to analyze, the process goes to block 2099.

At block 2010, assuming simulation mode, the interconnect network 2514 and the receiver input load are reduced by RC reduction techniques to simplify the distributed parasitic load. U.S. Pat. No. 7,359,843 issued on Apr. 15, 2008 to inventors Igor Keller, et al., entitled ROBUST CALCULATION OF CROSSTALK DELAY CHANGE IN INTEGRATED CIRCUIT DESIGN, incorporated by reference, generally describes RC reduction techniques.

For the timing arcs along each signal path, such as timing arcs 2621 and 2632A-2623B, state space equations are generated for the given circuit cell/stage. With the reduced order model (ROM) of interconnect and the state space equations for the stage, the process then goes to block 2012.

At block 2012, a simulation mode analysis of the circuit cell/stage is performed to determine the output voltage waveform for the timing arcs along each signal path of the stage. The process then goes to block 2014.

At block 2014, a determination is made if there are further timing arcs or signal paths to analyze. If there are further timing arcs to analyze, the process loops back to block 2006. If there are no further timing arcs to analyze, the process goes to block 2099.

At block 2099, assuming all timing arcs of the circuit stage have been analyzed by either the lookup method or the simulation method, the process may end or go onto to process the next circuit cell/stage in a delay path of the integrated circuit.

Figure 21:
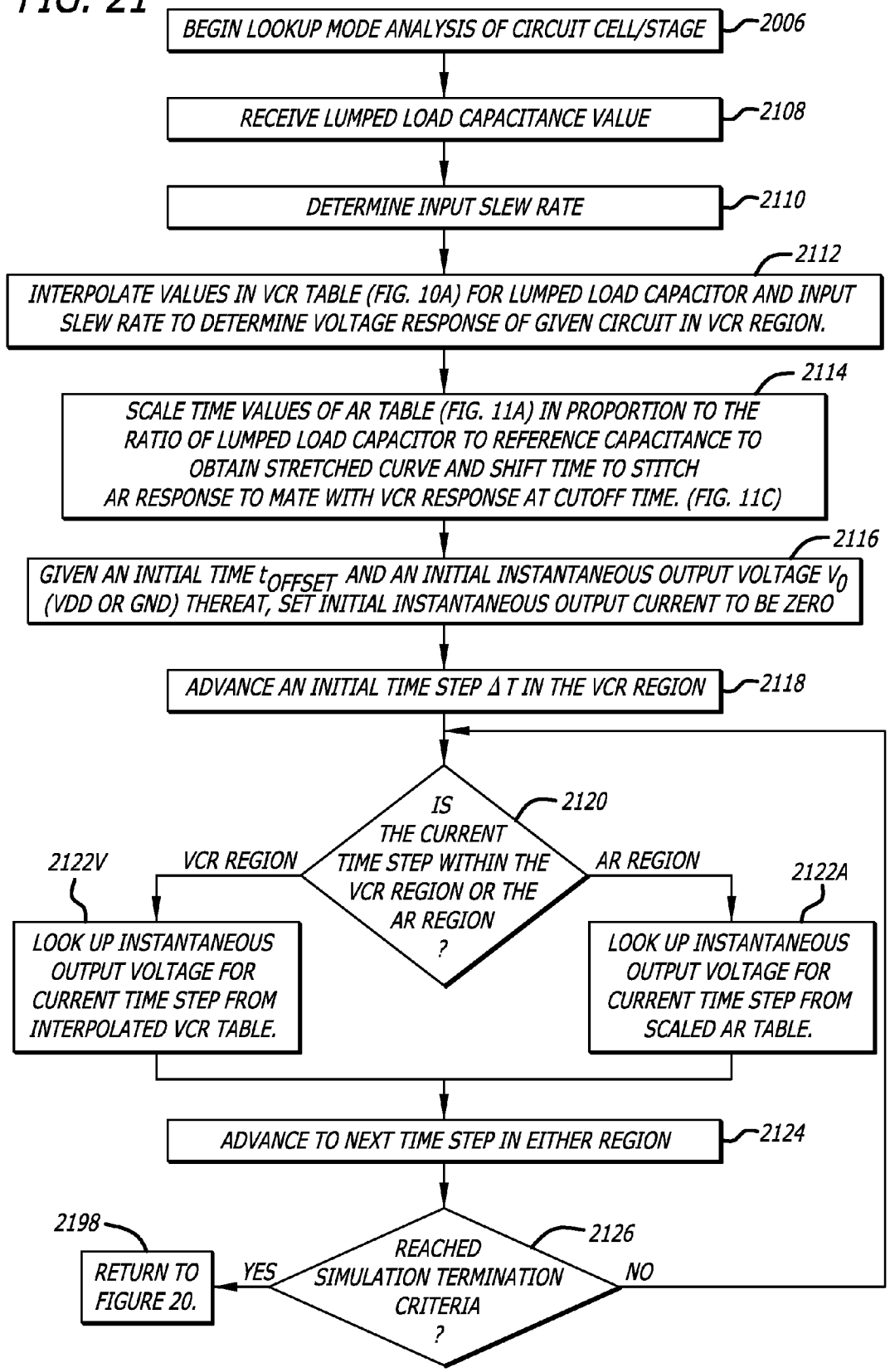
FIG. 21 is a flowchart illustrating a look-up mode delay calculation of timing arcs in a circuit cell/block using the multi-operating region gate model of the circuit cell/block.

Referring now to FIG. 21, details of a method of lookup mode analysis of the circuit cell/stage using the multi-operational gate model are illustrated. The first part of the output voltage transition is in the VCR region and may be determined by a two-dimensional interpolation with respect to input voltage slew and output capacitance load. The second part of the output voltage transition, also referred to as a tail, is in the AR region and may be determined by stretching a stored characterization in the AR region with respect to output capacitance load and stitching it at the cutoff time to the final output voltage of the VCR region.

The lookup mode analysis process begins at block 2006 and then goes to block 2108.

At block 2108, the value of the lumped capacitive load is received. The process then goes to block 2110.

At block 2110, the input slew rate of the input voltage waveform vi to the given circuit stage is determined. As described previously, in one embodiment, a rising edge slew rate may be determined as the time required for a rising signal to transition from 20% of supply voltage (Vdd) to 80% of Vdd, divided by 0.6. Similarly, in one embodiment, a falling edge slew rate may be determined from the time required for a falling signal to transition from 80% of Vdd to 20% of Vdd, divided by 0.6. After determining the slew rate, the process goes to block 2112.

At block 2112, given the lumped capacitive load and input slew rate, values for output voltage in the VCR region are interpolated from the three dimensional lookup table (FIG. 10A) to determine output voltage responses for the given circuit stage operating in the VCR region. With the input slew rate determined from process block 2110, the three dimensional table can be interpolated for input slew rate into a two dimensional table. The two dimensional table can be further interpolated into a one dimensional table using the lumped capacitance load having output voltage values for each time step of the time grid. A cutoff output voltage value may be determined at the cutoff time, a final time point in the time grid, from the interpolated VCR table.

Referring to momentarily to FIG. 7, output voltage response table representing characteristic curves 711-715 in the VCR region were previously formed for the interpreted input slew rate of the input voltage signal 701 with a time grid as illustrated. The time grid begins at an offset time $t_{offset}$ and ends at the cutoff time $t_{cutoff}$. The output voltage response table representing characteristic curves 711-715 in the VCR region may be further interpolated using the given lumped capacitive load. For example, assuming the lumped capacitive load $C_{load}$ is between reference capacitance loads $C_4$ and $C_5$ represented by curves 714-715 in the VCR region, an output voltage response curve 750 may be generated by interpolation represented by the one dimensional table. As illustrated, the cutoff output voltage $V_{cutoff}$ may be determined from the interpolated curve 750 at the cutoff time $t_{cutoff}$. Upon completion of the interpolated VCR table, the process then goes to block 2114 of FIG. 21.

At block 2114, the time and output voltage values in the AR region (FIG. 11A) are scaled in proportion to the ratio of lumped capacitive load to reference capacitance loads to obtain a stretched table of time (e.g., t' at grid voltage steps) and output voltage values and then shifted in time (e.g., t" at grid voltage steps) to properly stitch the AR response to the VCR response at the cutoff voltage and cutoff time (FIG. 11C).

Referring to FIG. 7, a pair of asymptotic curves 705, 710 representing output voltage response tails in the AR region for different reference capacitance loads may be represented by a pair of tables, such as those illustrated in FIG. 11A of the single table of FIG. 11B. For the actual lumped capacitance load $C_{load}$ applied to the circuit cell/stage, a linear interpolation of times with respect to capacitance loads may be performed to generate a time stretched curve 702A in the AR region. However, the voltage of the time stretched curve 702A at the cutoff time $t_{cutoff}$ may not match that of the response curve 750 at the cutoff time $t_{cutoff}$. The time stretched curve 702A is then shifted horizontally by a time shift $t_{shift}$ into the AR response curve 702B so that its voltage at the cutoff time $t_{cutoff}$ matches that of the response curve 750 at the cutoff time $t_{cutoff}$. The time shifting of the curve may also be referred to as curve stitching. The time stretching of the curve may also be referred to as curve scaling.

To linearly interpolate time to stretch (scale) a curve for a given capacitance load $Cl_{oad}$ on the stage, the following equation (given the reference capacitance loads $C_{refload1}$ and $C_{refload2}$) may be computed for each voltage point $V_z$ of the voltage grid in the AR characterization table:

$$t'_z = t_{1,z} + \frac{(t_{2,z} - t_{1,z})(C_{load} - C_{refload1})}{(C_{refload2} - C_{refload1})}.$$

To stitch the output voltage response in the AR region to the output voltage response in the VCR region, the time stretched curve 702A may be cut at an initial voltage that matches the cutoff voltage at the cutoff time. The time stretched curve 702A may then be shifted in time by a time shift $t_{shift}$ so that the response from the VCR region to the AR region continues around the cutoff voltage level $V_{cutoff}$. For each interpolated time t', the time shift is applied to determined a response time t" in the AR region associated with curve 702B by the following equation:

$$t'' = t' + t_{shift}.$$

After curve scaling (time stretching) and curve stitching (time shifting) in the AR region in response to the output capacitance load, the process then goes to block 2116.

At block 2116, given an initial time $t_{offset}$, the initial instantaneous output voltage V0 (VDD or Ground) is determined in accordance with its value in the steady state region. The table illustrated in FIG. 9 may be used to read out the output voltage in the steady state region. The process then goes to block 2118.

At block 2118, simulation time is advanced by an initial time step ΔT in the VCR region. The process then goes to block 2120 to begin a loop.

At block 2120, a determination is made if the current or present time step is within the VCR or AR operational regions for the model. If the current or present time step is in the VCR operating region, the process goes to block 2122V. If instead, the current or present time step is in the AR operating region, the process goes to block 2122A.

At block 2122V, given the current or present time step is in the VCR region, the instantaneous output voltage is looked up by interpolation from the interpolated VCR table for the given input slew and lumped output capacitance load.

After the instantaneous output voltage is looked up from the interpolated VCR table, the process then goes to block 2124.

At block 2122A, given the current or present time step, the instantaneous output voltage is looked up from the interpolated AR table. The process then goes to block 2124.

At block 2124, the simulation time is advanced to the next time step in either of the VCR region or the AR region. The process then goes to block 2126.

At block 2126, a determination is made if simulation termination criteria is reached. If the criteria is reached, the process goes to block 2198. If the criteria has not been reached, the process loops back to block 2120. Simulation termination criteria may be when a predetermined output voltage level is reached, such as one-hundredth of the positive power supply voltage (0.01Vdd) for a falling output transition or ninety-nine hundreths (0.99Vdd) for a rising output transition, for example.

At block 2198, the process returns to process 2008 illustrated in FIG. 20 to determine if there is another timing arc in the circuit stage to process.

Figure 6:
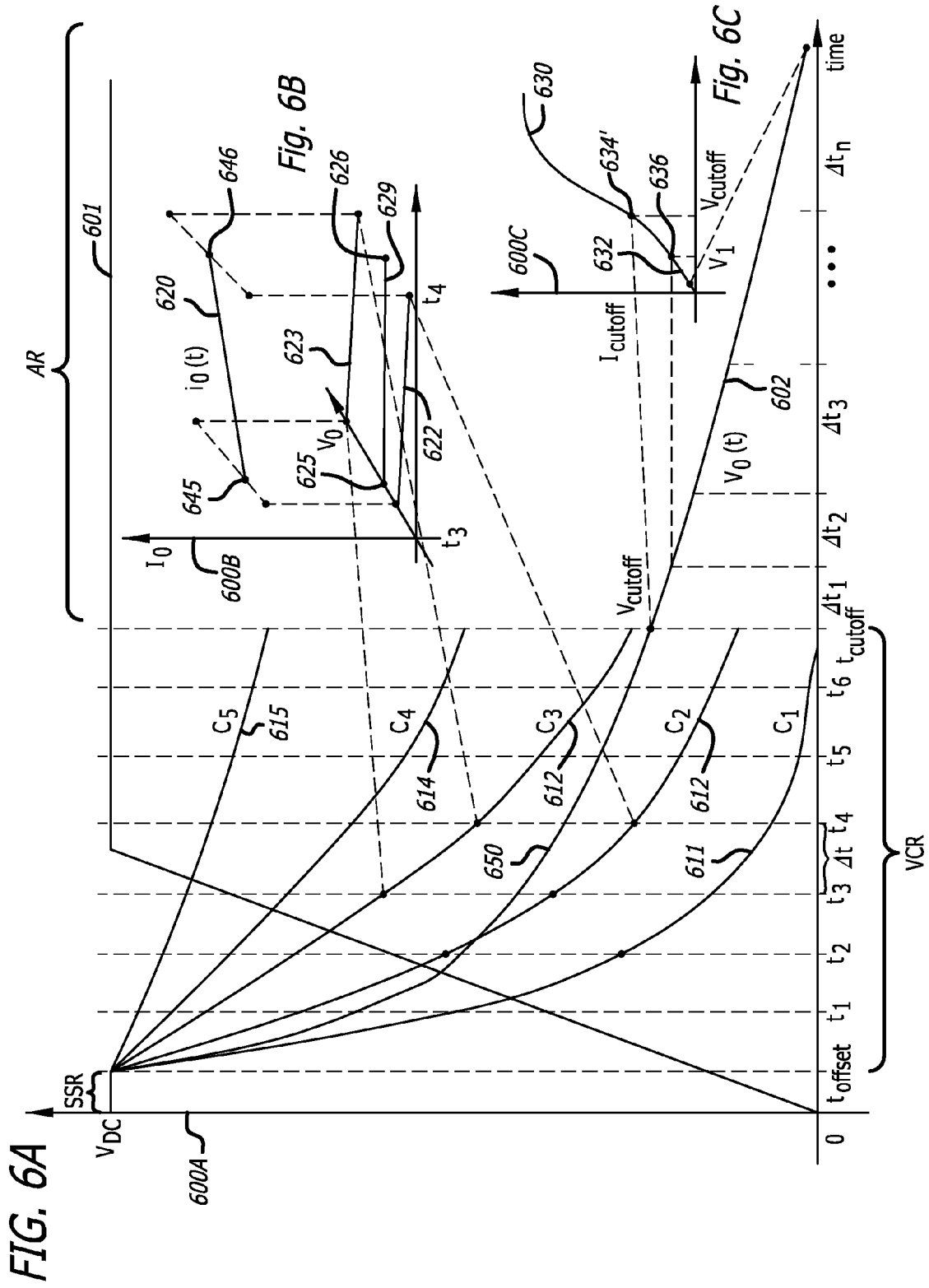
FIGS. 6A-6C illustrate characteristic curves and interpolated curves to determine output voltage over time in a simulation mode.

Reference is now made to FIG. 22 and FIGS. 6A-6C, assuming simulation mode for the multi-operating region gate model. FIGS. 6A-6C graphically illustrate how the multi-operating region gate model may be used in the simulation mode. In FIG. 22, a method of simulation mode analysis of the circuit cell/stage using the multi-operational gate model are illustrated beginning at block 2010. The process goes to block 2204.

At block 2204, given the determined input slew rate, the values in the VCR tables are interpolated to determine appropriate look up table values for the input slew rate. The three dimensional tables illustrated in FIGS. 10A-10C may be interpolated down to two dimensional tables for the determined input slew rate. The characteristic curves 611-615 in the VCR region illustrated in FIG. 6A are associated with the two dimensional tables (e.g., output voltage response table FIG. 10A) for the determined input slew rate of the input voltage waveform 601. The process then goes to block 2212.

At block 2212, given an initial offset time $T_{offset}$ and an initial instantaneous output voltage V0 (e.g., $V_{dc}$ of VDD or Ground), the initial instantaneous output current Io is set to zero. FIG. 6A illustrates a DC voltage $V_{dc}$ (e.g., VDD) in the steady state region prior to the offset time $t_{offset}$. The VCR region begins at the offset time $t_{offset}$ as shown in FIG. 6A. The process then goes to block 2214.

At block 2214, the simulation time is advanced by an initial time step ΔT in the VCR region. The process then goes to block 2215 to begin a loop.

At block 2215, a determination is made if the current time step is within the VCR or AR operational regions for the model. If the current time step is in the VCR operating region, the process goes to block 2216V. If instead, the current time step is in the AR operating region, the process goes to block 2216A.

At block 2216V, given the current or present time step is in the VCR region, the instantaneous output voltage is initially looked up from the interpolated VCR tables without reference to a capacitive load. The input slew rate is known such that three dimensional VCR tables may be interpolated down to two dimensional VCR tables for the given input slew rate. For example, the input slew rate may be between of and o2 with the tables of values for voltage, current, or admittance in each interpolated for that of the given input slew rate. For example, the VCR output voltage table of FIG. 10A may be interpolated into a two dimensional VCR output voltage table for the given input slew rate. The instantaneous output voltage of the prior time step (prior instantaneous output voltage) is used in the interpolated VCR output voltage table to determine an interpolated index value k'. For example, the prior instantaneous output voltage at time $t_3$ may be between V2(t2) and V3(t3) so that the interpolated index value k' is between 2 and 3. This is equivalent to interpolating between the curves 612-613 at time step $t_3$ to determine the interpolated index value k' for a capacitive load between the reference capacitance loads of $C_2$ and $C_3$.

The current or present time step and the interpolated index value k' are then used to lookup the instantaneous output current value for the current time step in the VCR region from a two dimensional interpolated VCR output current table interpolated from the three dimensional tables of FIG. 10B, for example. In FIG. 6B, this may be point 645 at time $t_3$ for example of the interpolated output current response curve section 620 associated with the interpolated current table (from FIG. 10B). The process then goes to block 2220.

At block 2216A, given the current or present time step is in the AR region, the prior output voltage is used to lookup the instantaneous output current value for the current time step in the AR region. Without reference to an output load, the prior output voltage is used to interpolate into one or both of the AR tables of FIG. 11A or the AR table of FIG. 11B to determine an instantaneous output current value. For example, the prior output voltage value may be between $V_2$ and $V_3$. The instantaneous output current value may be interpolated to be between $I_{1,2}$ and $I_{1,3}$, using linear interpolation techniques for example. At the cutoff time, the cutoff voltage $V_{cutoff}$ may be used to determine a cutoff current $I_{cutoff}$ such as at point 632 along a curve section 632 of an asymptotic curve 630 illustrated in FIG. 6C. The current time step in the AR region may be further used to interpolate and determine the instantaneous output current value with the additional current information between $I_{2,2}$ and $I_{2,3}$. The process then goes to block 2220.

At block 2220, in response to the instantaneous output current within the VCR region or the AR region, the state space equations for the given stage are used to calculate the instantaneous output voltage for the current or present time step. The state space equations were generated previously at block 2010 of FIG. 20. As the state space equations account for the interconnect network, the instantaneous output voltage is that which may be input to an input pin of a receiver of the next stage. Continuing with the example in the VCR region, the instantaneous output voltage may be determined to be point 625 at time $t_3$ illustrated in FIG. 6B, for example, associated with the curve section 629 between curve sections 622-623 associated with the curves 612-613. The process then goes to block 2221.

At block 2221, the simulation time is advanced to the next time step in either of the VCR region or the AR region. If in the VCR region, the time step may uniformly change by the same time change ΔT in accordance with the time grid. If in the AR region, the time step may vary from point to point (e.g., $ΔT_1$, $ΔT_2$, $ΔT_3$, etc.) depending upon the rate of change in output current or output voltage from point to point. Continuing with the example in the VCR region, the next time step may be time step $t_4$. The process then goes to block 2236.

At block 2236, a determination is made if predetermined simulation termination criteria is reached. If the criteria is reached, the process goes to block 2298. If the criteria has not been reached, the process loops back to block 2215.

At block 2298, the process returns to process 2014 illustrated in FIG. 20 to determine if there is another timing arc in the circuit stage to process.

Continuing with the example in the VCR region with the present time step being $t_4$, assuming that the predetermined simulation termination criteria has not been met, the process loops back to block 2215.

Assuming at block 2215 the present time step $t_4$ is still in the VCR region, the process goes to block 2216V. At block 2216V, assuming the instantaneous output voltage was previously determined from the state space equations for time step $t_3$, such as at point 625 in FIG. 6B, it may be used in the interpolated VCR output voltage table to determine an interpolated index value k'. For example, the prior instantaneous output voltage at time $t_3$ may be between V2(t2) and V3(t3) so that the interpolated index value k' is between 2 and 3. This is equivalent to interpolating between the curves 612-613 at time step $t_3$ to determine the interpolated index value k' for a capacitive load between the reference capacitance loads of $C_2$ and $C_3$.

The current or present time step $t_4$ and the interpolated index value k' are then used to lookup the instantaneous output current value for the current time step in the VCR region from a two dimensional interpolated VCR output current table interpolated from the m+1 two dimensional tables for each input slew rate $\sigma_m$ (e.g., three dimensional tables with different time values $t_{mn}$) of FIG. 10B, for example. In FIG. 6B, this may be point 646 at time $t_4$ for example of the interpolated output current response curve section 620 associated with the interpolated current table (from FIG. 10B). The process then goes to repeat block 2220.

At block 2220, knowing the instantaneous output current (point 646 for example), the state space equations for the given stage are used to calculate the instantaneous output voltage for the current or present time step, time $t_4$ for example. The instantaneous output voltage may be determined to be point 626 at time $t_4$ illustrated in FIG. 6B, for example, associated with the curve section 629 between curve sections 622-623 associated with the curves 612-613. The process then goes to block 2221 to advance to the next time step and repeats in a loop until the predetermined simulation termination criteria are met.

Assuming the simulation is still in the AR region and the predetermined simulation termination criteria are not met, block 2216A may be repeated for the next time step. For the next time step, the state space equations for the given stage were used to calculate the instantaneous output voltage at block 2220. The prior output voltage is used to interpolate into one or both of the AR tables of FIG. 11A or the AR table of FIG. 11B to determine an instantaneous output current value. For example, the computed prior output voltage value may be $V_1$ in FIG. 6C. The instantaneous output current value may be interpolated to be $I_1$ at point 636 along the curve section 632 illustrated in FIG. 6C.

The process then goes to blocks 2220 and 2221 to advance to the next time step and repeats in a loop until the predetermined simulation termination criteria are met at block 2236.

State Space Equations and Simulation Mode

The modeled components of the circuit stage undergo an analysis to simplify the circuit stage and speed up a static timing analysis that is to be performed on the larger integrated circuit design that includes the given circuit stage. If the interconnect network includes a distributed parasitic network, instead of a lumped capacitor network, the multi-operating region gate model is used in a simulation mode analysis. In a simulation mode analysis, state space equations (ordinary differential equations) of a state space system may be used to find the output voltage response of the circuit cell/stage.

Generally, a circuit stage may be described by the following set of ordinary differential equations (commonly referred to as a state-space system) allowing one to calculate voltage waveforms on all nodes of interest (particularly the outputs of the circuit stage coupled to the receiver input pins of the next stage) as follows:

$$E\frac{dx}{dt} = Ax + Bu$$
$$v = Cx$$

In this set of state space equations, x is the vector of states for the circuit stage; A, E, B, C are state space matrices formed during resistor-capacitor (RC) interconnect network reduction (ROM generation); v is a vector of voltages at the taps (inputs to the final receivers of the stage) and ports (outputs of drivers of the stage); and u is a vector of current sources at the inputs of the circuit stage to model the victim driver and/or the aggressor driver. The state space equation system describes port and tap voltage responses v to nonlinear current source(s) u connected at port(s) of the RC network.

In general the nonlinear current sources attached to each port are nonlinear functions of time and (unknown) voltage at that port: $u_n = I_n(t, v_n)$. Additionally, current sources may be used to model aggressor drivers (for noise delay calculations) and have an additional parameter which may shift over time, reflecting the fact that transition at aggressor input can occur within certain timing or switching windows (SW). The current source for the $k^{th}$ aggressor is described by the equation $u_k = I_k(t - \tau_k, v_k)$, where k is the shift parameter for the $k^{th}$ aggressor.

Calculation of the voltages on the terminals (ports and taps) of the circuit stage may be performed by a numerical integration of state space equations or through perturbation methods. U.S. patent application Ser. No. 12/203,128; entitled FLEXIBLE NOISE AND DELAY MODELING OF CIRCUIT STAGES FOR STATIC TIMING ANALYSIS OF INTEGRATED CIRCUIT DESIGNS, filed by Igor Keller et al. on Sep. 2, 2008, and incorporated herein by reference in its entirety; describes further details of using and solving state space equations.

CONCLUSION

Simulation robustness and accuracy in modeling of gates, circuit cells, and circuit stages may be improved, if output currents and small-signal admittances can be obtained more directly obtained from the stored data.

The multi-operating region gate model has advantages in that it is accurate (has direct currents needed for simulation on distributed/coupled interconnect), it is robust (ensures physical responses), and can reduce the size of a cell library. Measurements for the multi-operating gate model are taken in a more organized way for current look-up during simulation. The current data points for the VCR region are taken on a common time axis for all loads under the same input slew, minimizing the risk of numerical problems with deriving the small-signal admittance. The data points for the AR region may be taken on a common output voltage axis.

The multi-operating region gate model is characterized for both current and voltage responses so that it may be used for distributed loads (noise analysis) by simulation and a fast lookup with a lumped load. With a uniform time grid in the VCR region and a uniform voltage grid in the AR region, the characterization process may be simpler. Moreover in the AR region, after the input has transitioned to a stable state—the cutoff time, the output current can be described by a compact function of voltage I(v) independent of capacitive load and time. The AR region can be characterized with fewer data points leading to a reduction in the size of the model while maintaining accuracy. In addition, the multi-operating region model allows for shorter characterization times since multiple loads can be simulated at once. The multi-operating region gate model does not need to use a non-linear delay model table. The multi-operating region gate model can not only be used for delay calculation, but also crosstalk noise calculations. The multi-operating region gate model can provide a stable timing simulation (ensures physical small-signal admittance). An output response may be found semi-analytically by using stretching techniques.

When implemented in software, the elements of the embodiments of the invention are essentially the program, code segments, or instructions to perform the necessary tasks. The program, code segments, or instructions can be stored in a processor readable medium or storage device that can be read and executed by a processor. The processor readable medium may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, and a magnetic disk. The program or code segments may be downloaded via computer networks such as the Internet, Intranet, etc and stored in the processor readable medium or storage device.

When implemented as an electronic computer aided design (ECAD) system, the elements of the embodiments of the invention include one or more processor to execute the program, code segments, or instructions that may be stored in a processor readable medium or storage device to perform the tasks or functions of a method or process. The one or more processors may be specifically adapted to electronic computer aided design including processing logic that may comprise hardware (e.g., circuitry, dedicated logic, etc.), software, or a combination of both.

A computing system adapted to perform electronic computer aided design (ECAD) may be used to perform some or all of the processes described herein. The computing system includes a processor, a memory, a removable media drive, and a hard disk drive. The processor within the computer executes instructions stored in a machine-readable storage device such as the hard disk drive or a removable storage device (e.g., an optical medium (compact disk (CD), digital video disk (DVD), etc.), a magnetic medium (magnetic disk, a magnetic tape, etc.), or a combination of both. The instructions may be loaded from the machine-readable storage device into the memory, which may include Random Access Memory (RAM), dynamic RAM (DRAM), etc. The processor may retrieve the instructions from the memory and execute the instructions to perform the operations described herein.

Some portions of the preceding detailed description may have been presented in terms of algorithms and symbolic representations that perform operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities may take the form of electrical (e.g., current or voltage) or magnetic signals capable of being stored, transferred, combined, compared, and otherwise manipulated. It has proven convenient at times, principally for reasons of common usage, to refer to these signals as bits, values, levels, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention are thus described. While embodiments of the invention have been particularly described, they should not be construed as limited by such embodiments. Additionally, the embodiments of the invention are not described with reference to any particular programming language. It will be appreciated that a variety of programming languages may be used to implement the teachings of the invention as described herein. Instead, the embodiments of the invention should be construed according to the claims that follow below.

What is claimed is:

1. A system for analysis of an integrated circuit design, the system comprising:
    a processor to execute instructions to perform operations in analyzing timing of an integrated circuit design; and
    a processor readable storage device to store instructions that when executed by the processor cause the processor to perform operations including
        modeling a logic gate with a constant direct current (DC) voltage source during a steady state region of operation;
        in response to a transition from the steady state region of operation, modeling the logic gate with a time-varying voltage dependent current source during a varying current region of operation, wherein an instantaneous output current provided by the time varying voltage dependent current source is responsive to time and an instantaneous output voltage of the logic gate; and
        in response to a transition from the variable current region of operation, modeling the logic gate with a time-invariant voltage dependent current source during an asymptotic region of operation, wherein an instantaneous output current provided by the time-invariant voltage dependent current source is responsive to instantaneous output voltage of the logic gate independent of time.

2. The system of claim 1, wherein
output current of the logic gate in the steady state region of operation is substantially zero.

3. The system of claim 1, wherein
the transition from the steady state region of operation occurs at an offset time when the instantaneous output voltage of the logic gate starts to change from a steady state voltage level in response to an input voltage transition at an input pin of the logic gate.

4. The system of claim 1, wherein
an input pin of the logic gate is at a first steady state level in the steady state region of operation; and
the transition from the varying current region of operation occurs at a cutoff time when the instantaneous output voltage and current of the logic gate begins to behave asymptotically with respect to time.

5. The system of claim 4, wherein
the cutoff time is responsive to the input slew rate of the input voltage transition at the input pin.

6. The system of claim 4, wherein
the cutoff time is after an input voltage transition at an input pin of the logic gate reaches a second steady state level.

7. The system of claim 1, wherein
an output voltage response of the logic gate in the asymptotic region of operation is an asymptotic transition with respect to time.

8. A non-transitory machine readable product for timing analysis of an integrated circuit design, the non-transitory machine readable product comprising:
- a machine readable storage device having stored therein machine readable instructions
    - to model a logic gate with different current source models for a steady state region of operation, a varying current region of operation, and an asymptotic region of operation;
    - in response to a transition at an input of the logic gate, to determine instantaneous output current for the varying current region of operation in response to time and an instantaneous output voltage of the logic gate, and
    - in response to the transition at the input of the logic gate, to determine instantaneous output current for the asymptotic region of operation in response to the instantaneous output voltage of the logic gate independent of time.

9. The non-transitory machine readable product of claim 8, wherein
- the current source model for the steady state region of operation is an open circuit,
- the current source model for the varying current region of operation is a time varying voltage dependent current source, and
- the current source model for the asymptotic region of operation is a time-invariant voltage dependent current source.

10. The non-transitory machine readable product of claim 8, wherein
- a boundary between the steady state region of operation and the varying current region of operation is reached at an offset time when the instantaneous output voltage of the logic gate starts to change from a steady state voltage level in response to the input voltage transition at the input pin of the logic gate, and
- a boundary between the varying current region of operation and the asymptotic region of operation is reached at a cutoff time when the instantaneous output voltage and the instantaneous output current of the logic gate begins to behave asymptotically with respect to time.

11. The non-transitory machine readable product of claim 9, wherein
- a terminal of the open circuit has a constant voltage for the steady state region of operation.

12. A method for analyzing timing of an integrated circuit design, the method comprising:
with a processor
- modeling a logic gate with a constant direct current (DC) voltage source during a steady state region of operation;
- in response to a transition from the steady state region of operation, modeling the logic gate with a time-varying voltage dependent current source during a varying current region of operation, wherein an instantaneous output current provided by the time varying voltage dependent current source is responsive to time and an instantaneous output voltage of the logic gate; and
- in response to a transition from the variable current region of operation, modeling the logic gate with a time-invariant voltage dependent current source during an asymptotic region of operation, wherein an instantaneous output current provided by the time-invariant voltage dependent current source is responsive to the instantaneous output voltage of the logic gate independent of time.

13. The method of claim 12, wherein
output current of the logic gate in the steady state region of operation is substantially zero.

14. The method of claim 12, wherein
the transition from the steady state region of operation occurs at an offset time when the instantaneous output voltage of the logic gate starts to change from a steady state voltage level in response to an input voltage transition at an input pin of the logic gate.

15. The method of claim 12, wherein
an input pin of the logic gate is at a first steady state level in the steady state region of operation; and
the transition from the varying current region of operation occurs at a cutoff time when the instantaneous output voltage and current of the logic gate begins to behave asymptotically with respect to time.

16. The method of claim 15, wherein
the cutoff time is responsive to the input slew rate of the input voltage transition at the input pin.

17. The method of claim 15, wherein
the cutoff time is after an input voltage transition at an input pin of the logic gate reaches a second steady state level.

18. The method of claim 12, wherein
an output voltage response of the logic gate in the asymptotic region of operation is an asymptotic transition with respect to time.

* * * * *